(12) United States Patent
Chang et al.

(10) Patent No.: US 12,063,773 B2
(45) Date of Patent: Aug. 13, 2024

(54) LAYOUT STRUCTURE INCLUDING ANTI-FUSE CELL

(71) Applicant: TAIWAN SEMICONDUCTOR MANUFACTURING CO., LTD., Hsinchu (TW)

(72) Inventors: Meng-Sheng Chang, Hsinchu County (TW); Chia-En Huang, Hsinchu County (TW); Wan-Hsueh Cheng, New Taipei (TW); Yao-Jen Yang, Hsinchu County (TW); Yih Wang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 106 days.

(21) Appl. No.: 17/589,580

(22) Filed: Jan. 31, 2022

(65) Prior Publication Data
US 2022/0157834 A1    May 19, 2022

Related U.S. Application Data

(63) Continuation of application No. 16/729,973, filed on Dec. 30, 2019, now Pat. No. 11,257,827.

(51) Int. Cl.
| | | |
|---|---|---|
| *G11C 17/00* | (2006.01) | |
| *G06F 30/392* | (2020.01) | |
| *G11C 17/16* | (2006.01) | |
| *G11C 17/18* | (2006.01) | |
| *H01L 23/522* | (2006.01) | |
| *H01L 23/528* | (2006.01) | |
| *H10B 20/20* | (2023.01) | |

(52) U.S. Cl.
CPC ............ *H10B 20/20* (2023.02); *G06F 30/392* (2020.01); *G11C 17/16* (2013.01); *G11C 17/18* (2013.01); *H01L 23/5226* (2013.01); *H01L 23/528* (2013.01)

(58) Field of Classification Search
CPC . G06F 30/392; H01L 23/528; H01L 23/5226; H10B 20/20
See application file for complete search history.

(56) References Cited

U.S. PATENT DOCUMENTS

| | | | |
|---|---|---|---|
| 9,196,377 B1 | 11/2015 | Park | |
| 9,443,860 B1 | 9/2016 | Sung | |
| 9,646,974 B1 | 5/2017 | Liaw | |
| RE48,085 E * | 7/2020 | Tanaka | ................ H01L 27/0207 |

(Continued)

*Primary Examiner* — Uyen Smet
(74) *Attorney, Agent, or Firm* — Maschoff Brennan

(57) ABSTRACT

A semiconductor device includes first and second active areas, a first gate, a first conductive segment, a first via and a first continuous gate. The first and second active areas extend in a first direction. The first gate crosses over the first active area and the second active area. The first gate includes a first gate portion and a second gate portion electrically isolated from each other. The first conductive segment crosses over the first active area and the second active area. The first via is arranged above the first conductive segment. The first active area and the second active area are coupled through the first conductive segment to the first via. The first continuous gate is disposed between the first conductive segment and the first gate, and crossing over the first active area and the second active area.

20 Claims, 15 Drawing Sheets

400

(56) References Cited

U.S. PATENT DOCUMENTS

| | | |
|---|---|---|
| 2012/0187497 A1 | 7/2012 | Zhong et al. |
| 2014/0167185 A1* | 6/2014 | Smayling .............. H01L 27/105 |
| | | 716/126 |
| 2016/0064390 A1 | 3/2016 | Choi et al. |
| 2016/0300843 A1 | 10/2016 | Jung |
| 2017/0200727 A1 | 7/2017 | Yoon et al. |
| 2017/0271367 A1 | 9/2017 | Baek et al. |
| 2018/0122804 A1* | 5/2018 | Jain .................... H01L 27/0207 |
| 2020/0321355 A1 | 10/2020 | Jeong et al. |

* cited by examiner

LAYOUT STRUCTURE INCLUDING ANTI-FUSE CELL

RELATED APPLICATIONS

The present application is a continuation application of U.S. application Ser. No. 16/729,973, filed on Dec. 30, 2019, which is herein incorporated by reference.

BACKGROUND

A non-volatile memory is able to retain data after the supply power is interrupted. Generally, the non-volatile memory is programmed to record data therein. There are various types of the non-volatile memory, including, for example, a multi-time programming memory (also referred to as MTP memory), a one-time programming memory (also referred to as OTP memory), and so on. Depending on characteristics, the one-time programming memory is also referred to as an anti-fuse memory. Before a memory cell in the one-time programming memory is programmed, the memory cell may have a high resistance storage state, and after the memory cell is programmed, the memory cell may have a low resistance storage state.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
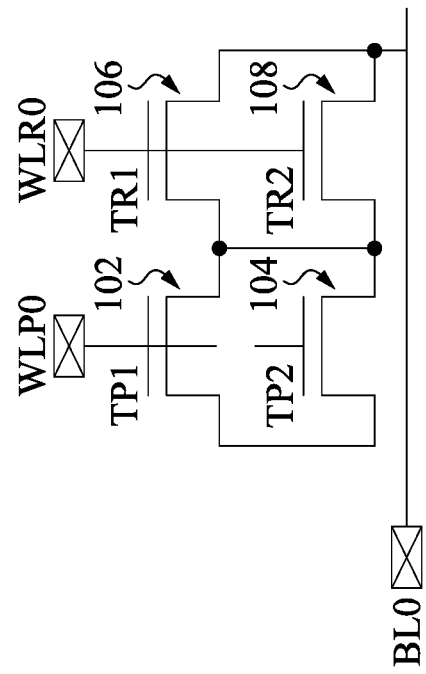
FIG. 1 is a circuit diagram of an anti-fuse memory cell in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Furthermore, spatially relative terms, such as "underlying," "below," "lower," "overlying," "upper" and the like, may be used throughout the description for ease of understanding to describe one element or feature's relationship to another element(s) or feature(s) as illustrated in the figures. The spatially relative terms are intended to encompass different orientations of the device in use or operation in addition to the orientation depicted in the figures. The structure may be otherwise oriented (e.g., rotated 90 degrees or at other orientations) and the spatially relative descriptors used herein may likewise be interpreted accordingly.

An anti-fuse memory device and cell structures therein are provided in accordance with various embodiments. Some variations of some embodiments are discussed.

Throughout various views and illustrative embodiments, like elements are designated with the like reference numbers for ease of understanding.

Reference is made to FIG. 1. FIG. 1 is a circuit diagram of an anti-fuse memory cell 100 in accordance with some embodiments of the present disclosure. In some embodiments, the anti-fuse memory cell 100 is also referred to as a one-time programming (OTP) memory cell. As shown in FIG. 1, the anti-fuse memory cell 100 includes a programming device 102, a programming device 104, a reading device 106, and a reading device 108. The programming device 102 is coupled to the reading device 106, and the programming device 104 is coupled to the reading device 108. The reading devices 106 and 108 are coupled to a bit line BL0.

In some embodiment, the programming device 102, the programming device 104, the reading device 106, and the reading device 108 are implemented with Metal-Oxide-Semiconductor (MOS) transistors. In some embodiments, the programming device 102, the programming device 104, the reading device 106, and the reading device 108 are implemented with N type MOS (NMOS) transistors. For illustration of FIG. 1, the programming device 102, the programming device 104, the reading device 106, and the reading device 108 are implemented with MOS transistors TP1, TP2, TR1, and TR2, respectively. A first source/drain terminal of the transistor TP1 is coupled to a first source/drain terminal of the transistor TP2, and a second source/drain terminal of the transistor TP1 is coupled to a first source/drain terminal of the transistor TR1, a second source/drain terminal of the transistor TP2, and a first source/drain terminal of the transistor TR2. Second source/drain terminals of the transistors TR1 and TR2 are coupled to the bit line BL0. A gate terminal of the transistor TP1 is coupled to a word line WLP0, and gate terminals of the transistors TR1 and TR2 are coupled to a word line WLR0.

As shown in FIG. 1, the gates of the transistors TP1-TP2 of the anti-fuse memory cell 100 are disconnected. In some embodiments, the gate of the transistor TP1 is coupled to the word line WLP0, and the gate of the transistor TP2 is isolated from the word line WLP0. As shown in FIG. 1, the gate of the transistor TP2 is floated. The configuration of the anti-fuse memory cell 100 is provided for illustrative purposes. Various configurations of the anti-fuse memory cell 100 are within the contemplated scope of the present disclosure. For example, in other embodiments, the gate of the transistor TP2 is coupled to the word line WLP0, and the gate of the transistor TP1 is isolated from the word line WLP0.

During the program operation, a ground voltage (0V) is provided to the bit line BL0, a selecting voltage Vdd is provided to the word line WLR0, and a programming voltage Vp is provided to the word line WLP0. In some embodiments, the magnitude of the programming voltage Vp is larger than that of the selecting voltage Vdd. For example, the magnitude of the programming voltage Vp ranges from about 3.6V to about 6V, and the selecting voltage Vdd ranges from about 1.5V to about 2.2V. In some other embodiments, the magnitude of the voltage on the bit line BL0 ranges from about 0V to about 0.5V.

When the transistors TR1 and TR2 are turned on in response to the selecting voltage Vdd applied to the word line WLR0 and the ground voltage is applied to the bit line BL0, the programming voltage Vp that is high enough is applied to the gate terminal of the transistor TP. Because the programming voltage Vp is beyond a withstanding voltage range of the gate, the gate of the transistor TP1 is ruptured. The ruptured gate is considered as a resistor with a low resistance value. The anti-fuse memory cell 100 accordingly generates the program current flowing to the bit line BL0 through the turn-on transistors TR1 and TR2.

During the read operation, the ground voltage (0V) is provided to the bit line BL0, the selecting voltage Vdd is provided to the word line WLR0, and a read voltage Vr is provided to the word line WLP0. When the transistors TR1 and TR2 are turned on in response to the reading voltage Vdd, the transistor TP1 generates a read current in response to the read voltage Vr. The anti-fuse memory cell 100 accordingly generates the read current flowing through the transistors TR1 and TR2 to the bit line BL0. According to the magnitude of the read current flowing through the bit line BL0, the anti-fuse memory cell 100 is configured to have a storing state in some embodiments. In some embodiments, the magnitude of the selecting voltage Vdd is the same as that of the read voltage Vr. For example, the magnitude of the read voltage Vr ranges from about 1V to about 2V, and the selecting voltage Vdd ranges from about 0.75V to about 1.5V. In some other embodiments, the magnitude of the voltage on the bit line BL0 ranges from about 0V to about 0.5V.

Because the gate of the transistor TP2 is floated, the transistor TP2 is turned off. Therefore, the equivalent resistance between the first source/drain terminal and the second source/drain terminal of the transistor TP2 is very high. Compared to a path from the second source/drain terminal of the transistor TP1 to the second source/drain terminal of transistor TP2, an equivalent resistance of the path is much smaller than the equivalent resistance between the first source/drain terminal and the second source/drain terminal of the transistor TP2. Therefore, the transistor TP2 does not transmit the program current and/or read current from the first source/drain terminal to the second source/drain terminal or from the second source/drain terminal to the first source/drain terminal. Accordingly, the program current and/or read current flows through the second source/drain terminal of the transistor TP1 to the transistors TR1-TR2, and the program current and/or read current does not flow through the transistor TP2.

The above implementations of the programming device 102, the programming device 104, the reading device 106, and the reading device 108 are given for illustrative purposes. Various implementations of the programming device 102, the programming device 104, the reading device 106, and the reading device 108 are within the contemplated scope of the present disclosure. For example, depending on various manufacturing processes, the programming device 102, the programming device 104, the reading device 106, and the reading device 108 are implemented with various types of MOS transistors, including, for example, Fin Field Effect Transistors (FinFETs), in various embodiments. For another example, in various embodiments, the programming device 102, the programming device 104, the reading device 106, and the reading device 108 as discussed above are implemented with a single transistor. For illustration, the transistors TP1, TP2, TR1, and TR2 as discussed above are manufactured as a single transistor to perform the same functions of the transistors TP1, TP2, TR1, and TR2.

In some approaches, gates, corresponding to, for example, the gates of the transistors TP1-TP2 of FIG. 1, have different withstanding voltages due to various processes and environments. The gates also provide paths for leakage current when the read operation is performed. When all of gates of the memory device are coupled to a programming word line, the memory device provides paths for leakage current at the gates of transistors which are not read in the read operation. The leakage current consumes the read current. Accordingly, when there are more paths for leakage current existed in the memory device, the read current need to be increased to maintain at a desired level. In such condition, the read voltage Vr needs to be increased to keep the read current at the desired level, and the performance of the operation (e.g., power consumption) is affected.

Compared to such approaches, in the embodiments of the present disclosure, for example with reference to FIG. 1, the gate of transistor TP2 is disconnected from the word line WLP0. Accordingly, the gate of the transistor TP2 provides no path for current flowing from the word line WLP0. When the read operation is performed, as shown in FIG. 1, because the gate of the transistor TP2 is isolated from the word line WLP0, there is no leakage current flowing from the word line WLP0 to the transistor TP2. In such structures, the read current in the read operation is not affected associated with the gate of the transistor TP2. The read current is able to be maintained at the desired level, and the read voltage Vr does not need to be increased. Accordingly, when the paths for leakage current are reduced, the leakage current is reduced, and the read current is able to be maintained higher with the same read voltage Vt. Alternatively stated, when the leakage current is reduced, a lower read voltage Vt is required to maintain the read current at the desired level. As a result, the read voltage Vt applying to the word line WLP0 in the read operation is reduced, and the performance of the operation (e.g., power consumption) is able to be improved.

Figure 2:
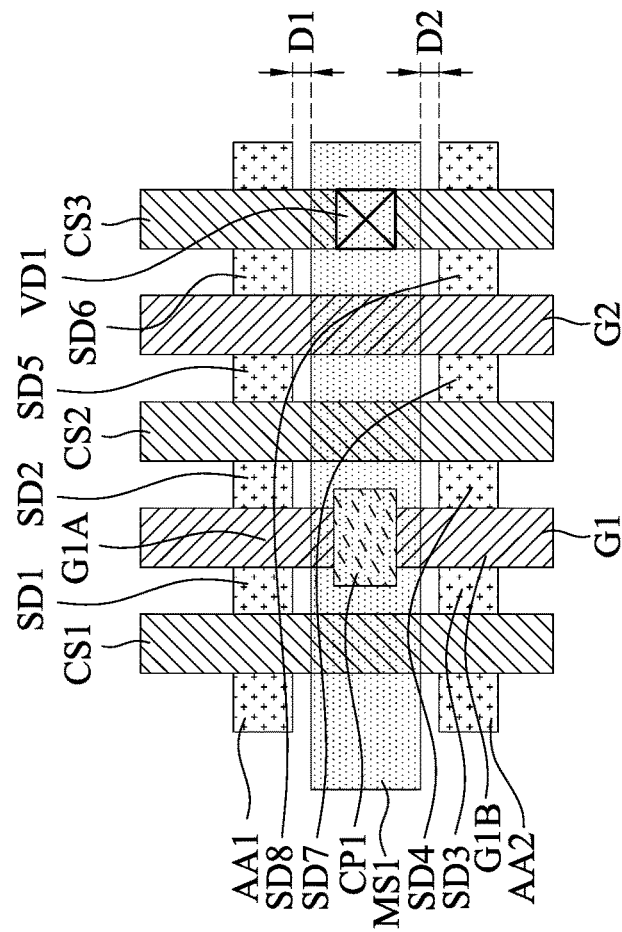
FIG. 2 is a layout structure of the anti-fuse memory cell shown in FIG. 1 in accordance with some embodiments of the present disclosure.
Figure 3:
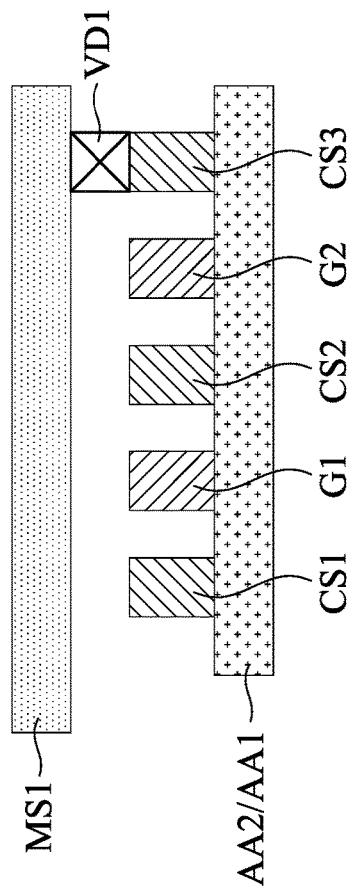
FIG. 3 is a schematic diagram illustrating a cross-section view, along an XY-plane, of the layout structure shown in FIG. 2 in accordance with some embodiments of the present disclosure.

Reference is made to FIGS. 2 and 3. FIG. 2 is a layout structure 200 of the anti-fuse memory cell 100 shown in FIG. 1 in accordance with some embodiments of the present disclosure. In some embodiments, the layout structure 200 corresponds to the anti-fuse memory cells 100 shown in FIG. 1. FIG. 3 is a schematic diagram 300 illustrating a cross-section view, along an XY-plane, of the layout structure 200 shown in FIG. 2 in accordance with some embodiments of the present disclosure. For ease of understanding, the embodiments with respect to FIG. 2 are discussed with reference to FIG. 3.

As shown in FIG. 2, the layout structure 200 includes an active area AA1, an active area AA2, a gate G1, a gate G2, a conductive segment CS1, a conductive segment CS2, a conductive segment CS3, a metal segment MS1, and a via VD1.

The gates G1-G2 and the conductive segments CS1-CS3 are arranged above the active areas AA1 and AA2, and the gates G1-G2 and the conductive segments CS1-CS3 extend to cross over the active areas AA1 and AA2. For illustration, the active area AA1 and the active area AA2 are separate to each other. The gates G1-G2 and the conductive segments CS1-CS3 are arranged to be separate from each other. As shown in FIG. 2, the conductive segment CS1, the gate G1, the conductive segment CS2, the gate G2, and the conductive segment CS3 are arranged in sequence along the X-direction.

In some embodiments, the active areas AA1 and AA2 are implemented by doped regions/areas, in order for the formation of the transistors included in the anti-fuse memory cell 100 as shown in FIG. 1. In some embodiments, the active area AA1 is configured for the source/drain regions of the transistor TP1 and transistor TR1 of the anti-fuse memory cell 100, and the active area AA2 is configured for the source/drain regions of the transistor TP2 and transistor TR2 of the anti-fuse memory cell 100. As shown in FIG. 2, a source/drain region SD1 corresponds to the first source/drain terminal of the transistor TP1, a source/drain region SD2 corresponds to the second source/drain terminal of the transistor TP1, a source/drain region SD3 corresponds to the first source/drain terminal of the transistor TP2, a source/drain region SD4 corresponds to the second source/drain terminal of the transistor TP2, a source/drain region SD5 corresponds to the first source/drain terminal of the transistor TR1, a source/drain region SD6 corresponds to the second source/drain terminal of the transistor TR1, a source/drain region SD7 corresponds to the first source/drain terminal of the transistor TR2, and a source/drain region SD8 corresponds to the second source/drain terminal of the transistor TR2.

As shown in FIG. 2, the gate G1 of the layout structure 200 includes a gate portion G1A and a gate portion G1B which is separate from the gate portion G1A. In some embodiments, the gate portion G1A and the gate portion G1B are electrically isolated from each other. Alternatively stated, the voltage and/or current on the gate portion G1A are electrically isolated from the voltage and/or current on the gate portion G1B. The gate portion G1A crosses over the active area AA1, and corresponds to the gate terminal of the transistor TP1. The gate portion G1B crosses over the active area AA2, and corresponds to the gate terminal of the transistor TP2.

In FIG. 2, a cut CP1 is illustrated to indicate that the gate portions G1A and G1B are separate. The cut CP1 is illustrated between the gate portions G1A and G1B. In some embodiments, the cut CP1 represents an empty space. In some embodiments, the cut CP1 is formed by performing a cut process (e.g., cut poly process) after the gate G1 is formed. The cut CP1 in the layout structure 200 is provided for illustrative purposes. Various cuts CP1 are within the contemplated scope of the present disclosure. For example, in various embodiments, the cut CP1 is filled with insulating materials.

In some embodiments, the gate portion G1A corresponds to the gate of the transistor TP1 of the anti-fuse memory cell 100, and the gate portion G1B corresponds to the gate of the transistor TP2 of the anti-fuse memory cell 100. The gate portion G1A is configured to receive the programming voltage Vp and/or read voltage Vr from the word line WLP0 (not shown in FIG. 2.) The gate G2, within the active area AA1 in the layout view, corresponds to the gate of the transistor TR1 of the anti-fuse memory cell 100, and the gate G2, within the active area AA2 in the layout view, corresponds to the gate of the transistor TR2 of the anti-fuse memory cell 100. The gate G2 is configured to receive the selecting voltage Vdd from the word line WLR0 (not shown in FIG. 2.)

In some embodiments, the conductive segments CS1-CS3 are implemented in order for the connections between the source/drain terminals of the transistors TP1-TP2 and the transistor TR1-TR2, as shown in FIG. 1. The conductive segment CS1 couples the source/drain region SD1 to the source/drain region SD3, in which the conductive segment CS1 corresponds to the connection between the first source/drain terminals of the transistors TP1 and TP2. The conductive segment CS2 couples the source/drain region SD2 to the source/drain region SD4, and couples the source/drain region SD5 to the source/drain region SD7, in which the conductive segment CS2 corresponds to the connection between the second source/drain terminals of the transistors TP1-TP2 and the first source/drain terminals of the transistors TR1-TR2. The conductive segment CS3 couples the source/drain region SD6 to the source/drain region SD8, in which the conductive segment CS3 corresponds to the connection between the second source/drain terminals of the transistors TR1 and TR2.

For illustration in FIG. 2, the via VD1 is arranged above the conductive segment CS3 and between the active area AA1 and the active area AA2. Alternatively stated, the via VD1 does not overlap the active areas AA1-AA2 in the layout view of the layout structure 200. The via VD1 couples the conductive segment CS3 to the metal segment MS1. In some embodiments, the source/drain regions SD6 and SD8, which correspond to second source/drain terminals of the transistor TR1-TR2, are coupled through the conductive segment CS3, the via VD1, and the metal segment MS1 to the bit line BL0 (not shown in FIG. 2.) The metal segment MS1 is configured to transmit the program current and/or read current to the bit line BL0.

The above configuration of the layout structure 200 is provided for illustrative purposes. Various configurations of the layout structure 200 are within the contemplated scope of the present disclosure. For example, in various embodiments, a pitch D1 indicating a distance between the active area AA1 and the metal segment MS1 in the layout view of the layout structure 200 does not exist in the layout structure 200. For another example, in alternatively embodiments, the pitch D1 and a pitch D2 indicating a distance between the active area AA2 and the metal segment MS1 in the layout view of the layout structure 200 do not exist in the layout structure 200. Alternatively stated, a distance between the metal segment MS1 and the active area AA1 and between the metal segment MS1 and the active area AA2 in the layout view of the layout structure 200 are zero. For additional example, in various embodiments, the layout structure 200 includes more gates configured as dummy gates, in which a "dummy gate" does not act as the gate for MOS devices in some embodiments.

As shown in FIG. 3, the conductive segments CS1-CS3 and the gates G1-G2 are coupled to the active areas AA1-AA2. The via VD1 is coupled between the conductive segment CS3 and the metal segment MS1. In the schematic diagram 300, the conductive segments CS1-CS3 and the gates G1-G2 have substantially the same height in a Z-direction. Therefore, the via VD1 is disposed higher than the gates G1-G2 and the conductive segments CS1-CS3 in the Y-direction, and the metal segment MS1 is disposed higher than the via VD1 in the Z-direction.

The configuration of schematic diagram 300 is provided for illustrative purposes. Various configurations of the schematic diagram 300 are within the contemplated scope of the present disclosure. For example, in various embodiments, the height of conductive segments CS1-CS3 is different from the height of the gates G1-G2.

Figure 4:
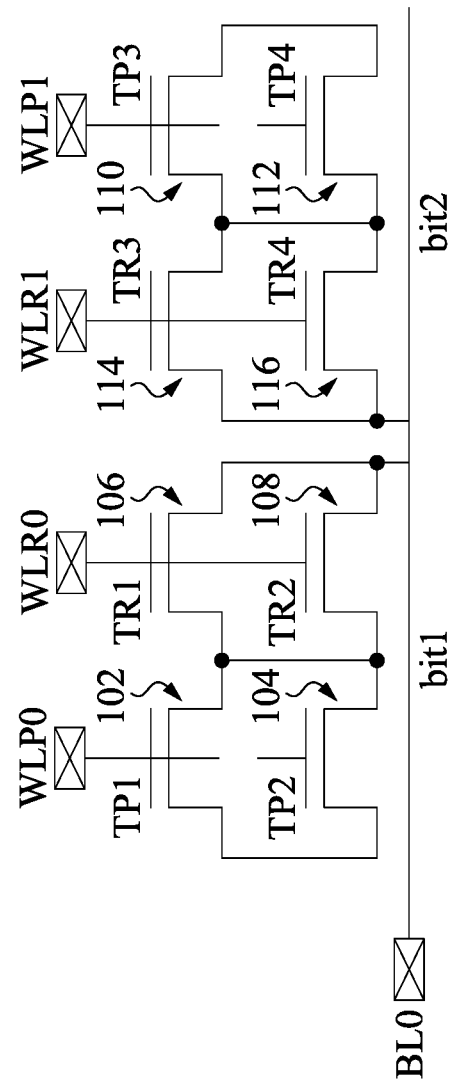
FIG. 4 is a circuit diagram of anti-fuse memory cells, in accordance with some embodiments of the present disclosure.

Reference is made to FIG. 4. FIG. 4 is a circuit diagram of anti-fuse memory cells 400 in accordance with some embodiments of the present disclosure. The anti-fuse memory cells 400 include bit 1 and bit 2. In some embodiments, bit 1 and bit 2 represent two anti-fuse memory cells coupled to a same bit line BL0. In some embodiments, bit 1 is the anti-fuse memory cell 100 shown in FIG. 1, and the bit 2 is similar to the bit 1. In order to facilitate understanding, similar components in FIG. 4 are designed with the same reference numerals with reference to FIG. 1.

As shown in FIG. 4, the bit 1 includes a programming device 102, a programming device 104, a reading device 106, and a reading device 108. The programming device 102 is coupled to the reading device 106, and the programming device 104 is coupled to the reading device 108. The reading devices 106 and 108 are coupled to the bit line BL0. The bit 2 includes a programming device 110, a programming device 112, a reading device 114, and a reading device 116. The programming device 110 is coupled to the reading device 114, and the programming device 112 is coupled to the reading device 116. The reading devices 114 and 116 are coupled to the bit line BL0.

In some embodiments, the programming device 102, 104, 110, and 112, and the reading device 106, 108, 114, and 116 are implemented with NMOS transistors. For illustration of FIG. 4, the programming device 102, 104, 110, and 112, and the reading device 106, 108, 114, and 116 are implemented with NMOS transistors TP1, TP2, TP3, TP4, TR1, TR2, TR3, and TR4, respectively.

A first source/drain terminal of the transistor TP1 is coupled to a first source/drain terminal of the transistor TP2, and a second source/drain terminal of the transistor TP1 is coupled to a first source/drain terminal of the transistor TR1, a second source/drain terminal of the transistor TP2, and a first source/drain terminal of the transistor TR2. Second source/drain terminals of the transistors TR1 and TR2 are coupled to the bit line BL0. A first source/drain terminal of the transistor TP3 is coupled to a first source/drain terminal of the transistor TP4, and a second source/drain terminal of the transistor TP3 is coupled to a first source/drain terminal of the transistor TR3, a second source/drain terminal of the transistor TP4, and a first source/drain terminal of the transistor TR4. Second source/drain terminals of the transistors TR3 and TR4 are coupled to the bit line BL0.

A gate terminal of the transistor TP1 is coupled to a word line WLP0, and gate terminals of the transistors TR1 and TR2 are coupled to a word line WLR0. A gate terminal of the transistor TP3 is coupled to a word line WLP1, and gate terminals of the transistors TR3 and TR4 are coupled to a word line WLR1. In some embodiments, gate terminals of the transistors TP2 and TP4 are electrically isolated from the word lines WLP0 and WLP1, respectively. In some embodiments, the gate terminals of the transistors TP2 and TP4 are floated.

In some embodiments, the read operation and the program operation of the anti-fuse memory cells 400 are similar to the read operation and the program operation of the anti-fuse memory cell 100. Accordingly, the read operation and the program operation are not further detailed herein.

Figure 5:
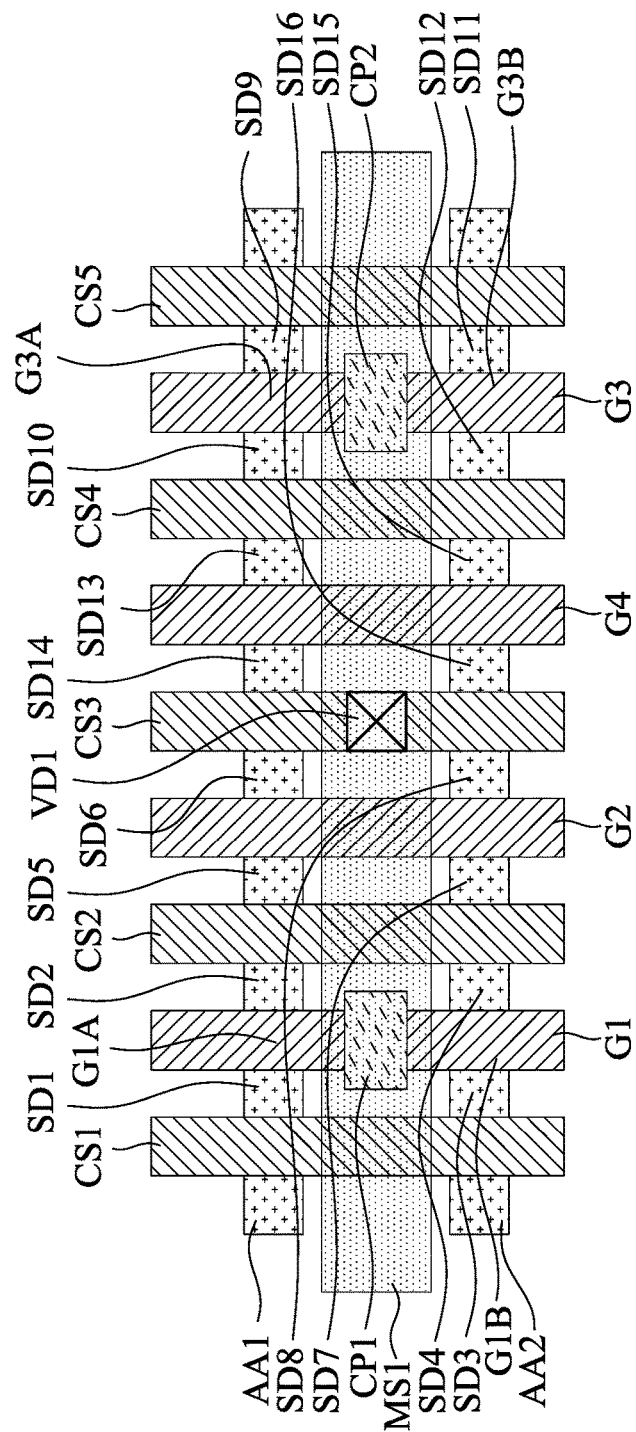
FIG. 5 is a layout structure of the anti-fuse memory cells shown in FIG. 4, in accordance with some embodiments of the present disclosure.

Reference is made to FIG. 5. FIG. 5 is a layout structure 500 of the anti-fuse memory cells 400 shown in FIG. 4 in accordance with some embodiments of the present disclosure. In some embodiments, the layout structure 200 is part of the layout structure 500. In order to facilitate understanding, similar components in FIG. 5 are designated with the same reference numerals with reference to FIG. 2.

As shown in FIG. 5, the layout structure 500 includes an active area AA1, an active area AA2, a gate G1, a gate G2, a gate G3, a gate G4, a conductive segment CS1, a conductive segment CS2, a conductive segment CS3, a conductive segment CS4, a conductive segment CS5, a metal segment MS1, and a via VD1.

The gates G1-G4 and the conductive segments CS1-CS5 are arranged above the active areas AA1 and AA2, and the gates G1-G4 and the conductive segments CS1-CS5 extend to cross over the active areas AA1 and AA2. For illustration, the active area AA1 and the active area AA2 are separate to each other. The gates G1-G4 and the conductive segments CS1-CS5 are arranged to be separate from each other. As shown in FIG. 5, the conductive segment CS1, the gate G1, the conductive segment CS2, the gate G2, the conductive segment CS3, the gate G4, the conductive segment CS4, the gate G3, and the conductive segment CS5 are arranged in sequence along the X-direction.

In some embodiments, the active areas AA1 and AA2 are implemented by doped regions/areas, in order for the formation of the transistors included in the anti-fuse memory cells 400 as shown in FIG. 4. In some embodiments, the active area AA1 is configured for the source/drain regions of the transistors TP1, TP3, TR1, and TR3 of the anti-fuse memory cells 400, and the active area AA2 is configured for the source/drain regions of the transistors TP2, TP4, TR2, and TR4 of the anti-fuse memory cells 400.

As shown in FIG. 5, a source/drain region SD1 corresponds to the first source/drain terminal of the transistor TP1, a source/drain region SD2 corresponds to the second source/drain terminal of the transistor TP1, a source/drain region SD3 corresponds to the first source/drain terminal of the transistor TP2, a source/drain region SD4 corresponds to the second source/drain terminal of the transistor TP2, a source/drain region SD5 corresponds to the first source/drain terminal of the transistor TR1, a source/drain region SD6 corresponds to the second source/drain terminal of the transistor TR1, a source/drain region SD7 corresponds to the first source/drain terminal of the transistor TR2, and a source/drain region SD8 corresponds to the second source/drain terminal of the transistor TR2. A source/drain region SD9 corresponds to the first source/drain terminal of the transistor TP3, a source/drain region SD10 corresponds to the second source/drain terminal of the transistor TP3, a source/drain region SD11 corresponds to the first source/drain terminal of the transistor TP4, a source/drain region SD12 corresponds to the second source/drain terminal of the transistor TP4, a source/drain region SD13 corresponds to the first source/drain terminal of the transistor TR3, a source/drain region SD14 corresponds to the second source/drain terminal of the transistor TR3, a source/drain region SD15 corresponds to the first source/drain terminal of the transistor TR4, and a source/drain region SD16 corresponds to the second source/drain terminal of the transistor TR4.

As shown in FIG. 5, the gate G1 of the layout structure 500 includes a gate portion G1A and a gate portion G1B which is separate from the gate portion G1A, and the gate G3 of the layout structure 500 includes a gate portion G3A and a gate portion G3B which is separate from the gate portion G3A. In some embodiments, the gate portion G1A and the gate portion G1B are electrically isolated from each other, and the gate portion G3A and the gate portion G3B are electrically isolated from each other. Alternatively stated, the voltage and/or current on the gate portion G1A are electrically isolated from the voltage and/or current on the gate portion G1B, and the voltage and/or current on the gate portion G3A are electrically isolated from the voltage and/or current on the gate portion G3B. The gate portion G1A crosses over the active area AA1, and corresponds to the gate terminal of the transistor TP1. The gate portion G1B crosses over the active area AA2, and corresponds to the gate terminal of the transistor TP2. The gate portion G3A crosses over the active area AA1, and corresponds to the gate terminal of the transistor TP3. The gate portion G3B crosses over the active area AA2, and corresponds to the gate terminal of the transistor TP4.

The gate portions G1A and G3A are configured to receive the programming voltage Vp and/or read voltage Vr from the word lines WLP0 and WLP1 (not shown in FIG. 5,) respectively The gates G2 and G4 are configured to receive the selecting voltage from the word line WLR0 and WRL1 (not shown in FIG. 5,) respectively.

In FIG. 5, a cut CP1 is illustrated to indicate that the gate portions G1A and G1B are separate, and a cut CP2 is illustrated to indicate that the gate portions G3A and G3B are separate. The cut CP1 is illustrated between the gate portions G1A and G1B, and the cut CP2 is illustrated between the gate portions G3A and G3B. In some embodiments, the cuts CP1-CP2 represent empty space. In some embodiments, the cuts CP1-CP2 are formed by performing a cut process (e.g., cut poly process) after the gates G1-G4 are formed. The cuts CP1-CP2 in layout structure 500 are provided for illustrative purposes. Various cuts CP1-CP2 are within the contemplated scope of the present disclosure.

In some embodiments, the conductive segments CS1-CS5 are implemented in order for the connections between the source/drain terminals of the transistors TP1-TP4 and the transistors TR1-TR4, as shown in FIG. 4. The conductive segment CS1 couples the source/drain region SD1 to the source/drain region SD3, in which the conductive segment CS1 corresponds to the connection between the first source/drain terminals of the transistors TP1 and TP2. The conductive segment CS2 couples the source/drain region SD2 to the source/drain region SD4, and couples the source/drain region SD5 to the source/drain region SD7, in which the conductive segment CS2 corresponds to the connection between the second source/drain terminals of the transistors TP1-TP2 and the first source/drain terminals of the transistors TR1-TR2. The conductive segment CS3 couples the source/drain region SD6 to the source/drain region SD8, and couples the source/drain region SD14 to the source/drain region SD16, in which the conductive segment CS3 corresponds to the connection between the second source/drain terminals of the transistors TR1 and TR2 and the second source/drain terminals of the transistors TR3-TR4. The conductive segment CS5 couples the source/drain region SD9 to the source/drain region SD11, in which the conductive segment CS5 corresponds to the connection between the first source/drain terminals of the transistors TP3 and TP4. The conductive segment CS4 couples the source/drain region SD10 to the source/drain region SD12, and couples the source/drain region SD13 to the source/drain region SD15, in which the conductive segment CS4 corresponds to the connection between the second source/drain terminals of the transistors TP3-TP4 and the first source/drain terminals of the transistors TR3-TR4.

In the active area AA1, in some embodiments, the source/drain regions SD2 and SD5 are a continuous region and electrically coupled to each other. The source/drain regions SD6 and SD14 are a continuous region and electrically coupled to each other. The source/drain regions SD10 and SD13 are a continuous region and electrically coupled to each other. Similarly, in the active area AA2, in some embodiments, the source/drain regions SD4 and SD7, the source/drain regions SD8 and SD16, and the source/drain regions SD12 and SD15 are continuous regions, and electrically coupled to each other, respectively.

As shown in FIG. 5, the via VD1 is arranged above the conductive segment CS3 and between the active area AA1 and the active area AA2. Alternatively stated, the via VD1 does not overlap the active areas AA1-AA2 in the layout view of the layout structure 500. The via VD1 couples the conductive segment CS3 to the metal segment MS1. In some embodiments, the source/drain regions SD6 and SD8, which correspond to second source/drain terminals of the transistors TR1-TR2, and the source/drain regions SD14 and SD16, which correspond to second terminals of the transistors TR3-TR4, are coupled through the conductive segment CS3, the via VD1, and the metal segment MS1 to the bit line BL0 (not shown in FIG. 5.) The metal segment MS1 is configured to transmit the program current and/or read current to the bit line BL0.

The above configuration of the layout structure 500 is provided for illustrative purposes. Various configurations of the layout structure 500 are within the contemplated scope of the present disclosure. For example, in various embodiments, the gate portions G1A and G3A are electrically isolated from the word lines WLP0 and WLP1, respectively, and the gate portions G1B and G3B are coupled to the word lines WLP0 and WLP1, respectively.

Figure 6:
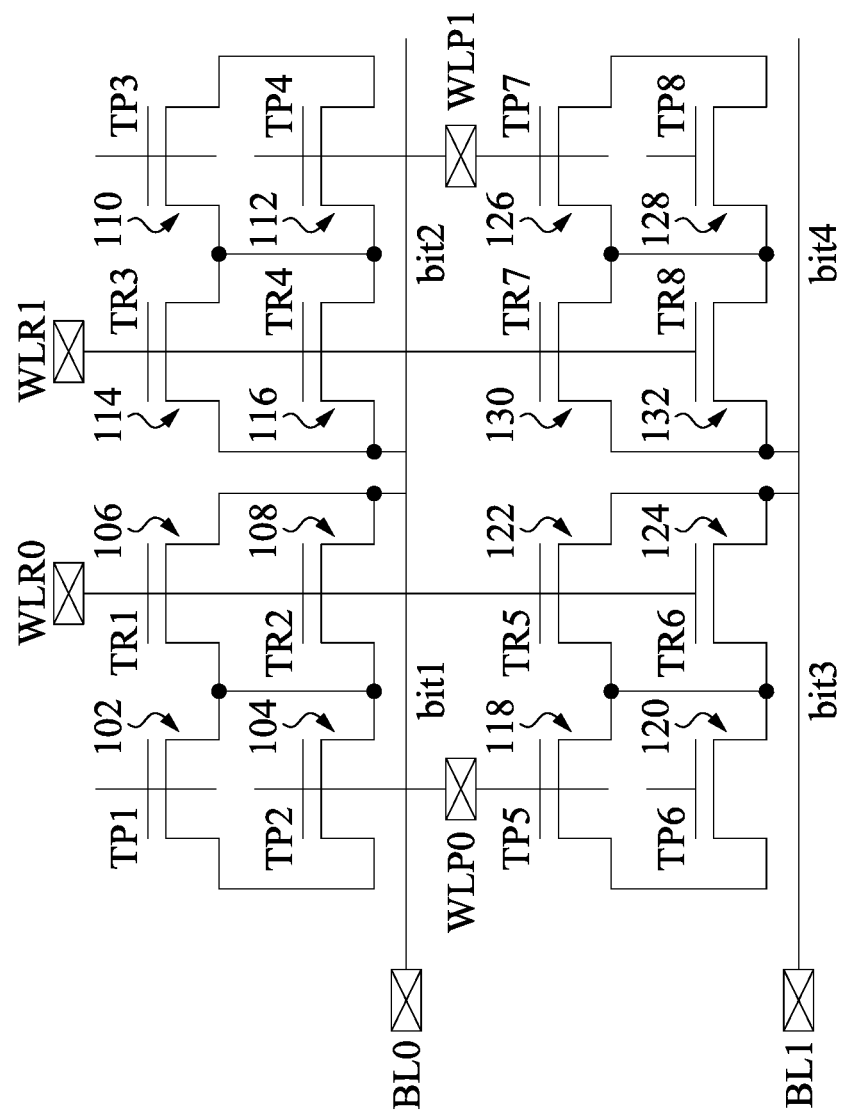
FIG. 6 is a circuit diagram of an anti-fuse memory cell array in accordance with some embodiments of the present disclosure.

Reference is made to FIG. 6. FIG. 6 is a circuit diagram of an anti-fuse memory cell array 600 in accordance with some embodiments of the present disclosure. In some embodiments, the anti-fuse memory cells in the anti-fuse memory cell array 600 are similar to the anti-fuse memory cells 400 shown in FIG. 4. In order to facilitate understanding, similar components in FIG. 6 are designated with the same numerals with reference to FIG. 4. The anti-fuse memory cell array 600 includes a bit 1, a bit 2, a bit 3, and a bit 4. In some embodiments, the bits 1-4 represent 4 anti-fuse memory cells arranged in a 2×2 array.

As shown in FIG. 6, the bit 1 includes a programming device 102, a programming device 104, a reading device 106, and a reading device 108. The programming device 102 is coupled to the reading device 106, and the programming device 104 is coupled to the reading device 108. The bit 2 includes a programming device 110, a programming device 112, a reading device 114, and a reading device 116. The programming device 110 is coupled to the reading device 114, and the programming device 112 is coupled to the reading device 116. The reading devices 106, 108, 114 and 116 are coupled to a bit line BL0. Alternatively, bit 1 and bit 2 are arranged at a same row coupled to the bit line BL0. The bit 3 includes a programming device 118, a programming device 120, a reading device 122, and a reading device 124. The programming device 118 is coupled to the reading device 122, and the programming device 120 is coupled to the reading device 124. The bit 4 includes a programming device 126, a programming device 128, a reading device 130, and a reading device 132. The programming device 126 is coupled to the reading device 130, and the programming device 128 is coupled to the reading device 132. The reading devices 122, 124, 130 and 132 are coupled to a bit line BL1. Alternatively, bit 3 and bit 4 are arranged at a same row coupled to the bit line BL1.

As shown in FIG. 6, the programming device 104 of the bit 1 and the programming device 118 of the bit 3 are coupled to the word line WLP0, and the reading devices 106 and 108 of the bit 1 and the reading devices 122 and 124 of the bit 3 are coupled to the word line WLR0. Alternatively stated, the bit 1 and the bit 3 are arranged at a same column coupled to the word line WLP0 and/or WLR0. The programming device 112 of the bit 2 and the programming device 126 of the bit 4 are coupled to the word line WLP1, and the reading devices 114 and 116 of the bit 2 and the reading devices 130 and 132 of the bit 4 are coupled to the word line WLR1. Alternatively stated, the bit 2 and the bit 4 are arranged at a same column coupled to the word line WLP1 and/or WLR1.

In some embodiments, the programming device 102, 104, 110, 112, 118, 120, 126, and 128 and the reading device 106, 108, 114, 116, 122, 124, 130, and 132 are implemented with NMOS transistors. For illustration of FIG. 6, the programming device 102, 104, 110, 112, 118, 120, 126, and 128 and the reading device 106, 108, 114, 116, 122, 124, 130, and 132 are implemented with NMOS transistors TP1, TP2, TP3, TP4, TP5, TP6, TP7, TP8, TR1, TR2, TR3, TR4, TR5, TR6, TR7, and TR8, respectively.

A first source/drain terminal of the transistor TP1 is coupled to a first source/drain terminal of the transistor TP2, and a second source/drain terminal of the transistor TP1 is coupled to a first source/drain terminal of the transistor TR1, a second source/drain terminal of the transistor TP2, and a first source/drain terminal of the transistor TR2. Second source/drain terminals of the transistors TR1 and TR2 are coupled to the bit line BL0. A first source/drain terminal of the transistor TP3 is coupled to a first source/drain terminal of the transistor TP4, and a second source/drain terminal of the transistor TP3 is coupled to a first source/drain terminal of the transistor TR3, a second source/drain terminal of the transistor TP4, and a first source/drain terminal of the transistor TR4. Second source/drain terminals of the transistors TR3 and TR4 are coupled to the bit line BL0. A first source/drain terminal of the transistor TP5 is coupled to a first source/drain terminal of the transistor TP6, and a second source/drain terminal of the transistor TP5 is coupled to a first source/drain terminal of the transistor TR5, a second source/drain terminal of the transistor TP6, and a first source/drain terminal of the transistor TR6. Second source/drain terminals of the transistors TR5 and TR6 are coupled to the bit line BL1. A first source/drain terminal of the transistor TP7 is coupled to a first source/drain terminal of the transistor TP8, and a second source/drain terminal of the transistor TP7 is coupled to a first source/drain terminal of the transistor TR7, a second source/drain terminal of the transistor TP8, and a first source/drain terminal of the transistor TR8. Second source/drain terminals of the transistors TR7 and TR8 are coupled to the bit line BL1.

Gate terminals of the transistors TP2 and TP5 are coupled to a word line WLP0, and gate terminals of the transistors TR1, TR2, TR5, and TR6 are coupled to a word line WLR0. Gate terminals of the transistors TP4 and TP7 are coupled to a word line WLP1, and gate terminals of the transistors TR3, TR4, TR7, and TR8 are coupled to a word line WLR1. In some embodiments, gate terminals of the transistors TP1 and TP6 are electrically isolated from the word line WLP0, and gate terminals of the transistors TP3 and TP8 are electrically isolated from the word line WLP1. In some embodiments, gate terminals of the transistors TP1, TP3, TP6, and TP8 are floated.

In some embodiments, the read operation and the program operation of each row of the anti-fuse memory cell array 600 are similar to the read operation and the program operation of the anti-fuse memory cells 400. Accordingly, they are not further detailed herein.

Figure 7:
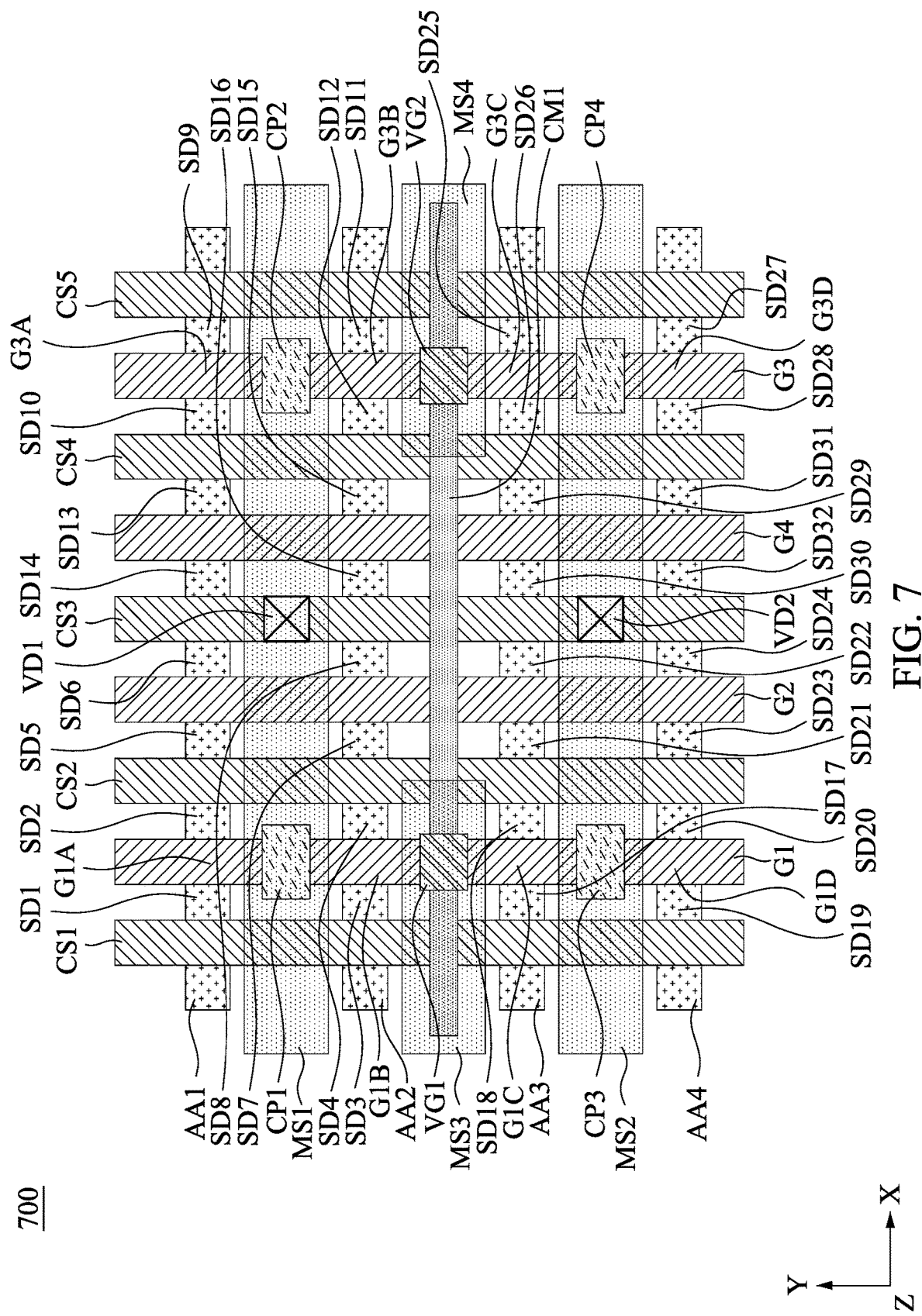
FIG. 7 is a layout structure of the anti-fuse memory cell array shown in FIG. 6, in accordance with some embodiments of the present disclosure.

Reference is made to FIG. 7. FIG. 7 is a layout structure 700 of the anti-fuse memory cell array 600 shown in FIG. 6 in accordance with some embodiments of the present disclosure. In some embodiments, the layout structure 500 is similar to the layout structure 700. In order to facilitate understanding, similar components in FIG. 7 are designated with the same reference numerals with reference to FIG. 5.

As shown in FIG. 7, the layout structure 700 includes an active area AA1, an active area AA2, an active area AA3, an active area AA4, a gate G1, a gate G2, a gate G3, a gate G4, a conductive segment CS1, a conductive segment CS2, a conductive segment CS3, a conductive segment CS4, a conductive segment CS5, a metal segment MS1, a metal segment MS2, a metal segment MS3, a metal segment MS4, a via VD1, a via VD2, a via VG1, and a via VG2.

The gates G1-G4 and the conductive segments CS1-CS5 are arranged above the active areas AA1-AA4, and the gates G1-G4 and the conductive segments CS1-CS5 extend to cross over the active areas AA1-AA4. For illustration, the active areas AA1-AA4 are separate to each other. The gates G1-G4 and the conductive segments CS1-CS5 are arranged to be separate from each other. As shown in FIG. 7, the conductive segment CS1, the gate G1, the conductive segment CS2, the gate G2, the conductive segment CS3, the gate G4, the conductive segment CS4, the gate G3, and the conductive segment CS5 are arranged in sequence along the X-direction.

In some embodiments, the active areas AA1-AA4 are implemented by doped regions/areas, in order for the formation of the transistors included in the anti-fuse memory cell array 600 as shown in FIG. 6. In some embodiments, the active area AA1 is configured for the source/drain regions of the transistors TP1, TP3, TR1, and TR3 of the anti-fuse memory cell array 600, the active area AA2 is configured for the source/drain regions of the transistors TP2, TP4, TR2, and TR4 of the anti-fuse memory cell array 600, the active area AA3 is configured for the source/drain regions of the transistors TP5, TP7, TR5, and TR7 of the anti-fuse memory cell array 600, and the active area AA4 is configured for the source/drain regions of the transistors TP6, TP8, TR6, and TR8 of the anti-fuse memory cell array 600.

In some embodiments, the arrangement of source/drain regions SD1-SD16 of the layout structure 500 is the same as an arrangement of source/drain regions SD1-SD16 of the layout structure 700. Accordingly, they are not further detailed herein. In FIG. 7, a source/drain region SD17 corresponds to the first source/drain terminal of the transistor TP5, a source/drain region SD18 corresponds to the second source/drain terminal of the transistor TP5, a source/drain region SD19 corresponds to the first source/drain terminal of the transistor TP6, a source/drain region SD20 corresponds to the second source/drain terminal of the transistor TP6, a source/drain region SD21 corresponds to the first source/drain terminal of the transistor TR5, a source/drain region SD22 corresponds to the second source/drain terminal of the transistor TR5, a source/drain region SD23 corresponds to the first source/drain terminal of the transistor TR6, and a source/drain region SD24 corresponds to the second source/drain terminal of the transistor TR6. A source/drain region SD25 corresponds to the first source/drain terminal of the transistor TP7, a source/drain region SD26 corresponds to the second source/drain terminal of the transistor TP7, a source/drain region SD27 corresponds to the first source/drain terminal of the transistor TP8, a source/drain region SD28 corresponds to the second source/drain terminal of the transistor TP8, a source/drain region SD29 corresponds to the first source/drain terminal of the transistor TR7, a source/drain region SD30 corresponds to the second source/drain terminal of the transistor TR7, a source/drain region SD31 corresponds to the first source/drain terminal of the transistor TR8, and a source/drain region SD32 corresponds to the second source/drain terminal of the transistor TR8.

As shown in FIG. 7, the gate G1 of the layout structure 700 includes a gate portion G1A, a gate portion G1B, a gate portion G1C, and a gate portion G1D, and the gate G3 of the layout structure 700 includes a gate portion G3A, a gate portion G3B, a gate portion G3C, and a gate portion G3D. In some embodiments, the gate portions G1A and G1B are separate from each other, the gate portions G3A and G3B are separate from each other, the gate portions G1C and G1D are separate from each other, and the gate portions G3C and G3D are separate from each other. In some embodiments, the gate portion G1A and the gate portion G1B are electrically isolated from each other, the gate portion G3A and the gate portion G3B are electrically isolated from each other, the gate portions G1C and G1D are electrically isolated from each other, and the gate portions G3C and G3D are electrically isolated from each other. Alternatively stated, the voltage and/or current on the gate portion G1A are electrically isolated from the voltage and/or current on the gate portion G1B, the voltage and/or current on the gate portion G3A are electrically isolated from the voltage and/or current on the gate portion G3B, the voltage and/or current on the gate portion G1C are electrically isolated from the voltage and/or current on the gate portion G1D, and the voltage and/or current on the gate portion G3C are electrically isolated from the voltage and/or current on the gate portion G3D. The gate portion G1A crosses over the active area AA1, and corresponds to the gate terminal of the transistor TP1. The gate portion G1B crosses over the active area AA2, and corresponds to the gate terminal of the transistor TP2. The gate portion G3A crosses over the active area AA1, and corresponds to the gate terminal of the transistor TP3. The gate portion G3B crosses over the active area AA2, and corresponds to the gate terminal of the transistor TP4. The gate portion G1C crosses over the active area AA3, and corresponds to the gate terminal of the transistor TP5. The gate portion G1D crosses over the active area AA4, and corresponds to the gate terminal of the transistor TP6. The gate portion G3C crosses over the active area AA3, and corresponds to the gate terminal of the transistor TP7. The gate portion G3D crosses over the active area AA4, and corresponds to the gate terminal of the transistor TP8.

As shown in FIG. 7, the gate portions G1B and G1C are a continuous gate portion and electrically coupled together, and gate portions G3B and G3C are a continuous gate portion and electrically coupled together.

The gate portions G1B and G1C are configured to receive the programming voltage Vp and/or read voltage Vr from the word line WLP0 (not shown in FIG. 7.) The gate portions G3B and G3C are configured to receive the programming voltage Vp and/or read voltage Vr from the word line WLP1 (not shown in FIG. 7.) The gates G2 and G4 are configured to receive the selecting voltage from the word line WLR0 and WRL1 (not shown in FIG. 7,) respectively.

In FIG. 7, a cut CP1 is illustrated to indicate that the gate portions G1A and G1B are separate, a cut CP2 is illustrated to indicate that the gate portions G3A and G3B are separate, a cut CP3 is illustrated to indicate that the gate portions G1C and G1D are separate, and a cut CP4 is illustrated to indicate that the gate portions G3C and G3D are separate. The cut CP1 is illustrated between the gate portions G1A and G1B, the cut CP2 is illustrated between the gate portions G3A and G3B, the cut CP3 is illustrated between the gate portions G1C and G1D, and the cut CP4 is illustrated between the gate portions G3C and G3D. In some embodiments, the cuts CP1-CP4 represent empty space. In some embodiments, the cuts CP1-CP4 are formed by performing a cut process (e.g., cut poly process) after the gates G1-G4 are formed. The cuts CP1-CP4 in layout structure 700 are provided for illustrative purposes. Various cuts CP1-CP4 are within the contemplated scope of the present disclosure.

In some embodiments, the conductive segments CS1-CS5 are implemented in order for the connections between the source/drain terminals of the transistors TP1-TP8 and the transistors TR1-TR8, as shown in FIG. 6. The arrangement of connections between the source/drain terminals of the transistors TP1-TP4 and TR1-TR4 associated with the conductive segments CS1-CS5 in layout structure 500 is the same as an arrangement of connections between the source/drain terminals of the transistors TP1-TP4 and TR1-TR4 in layout structure 700. Accordingly, they are not further detailed herein. In some embodiments, the conductive segment CS1 further couples the source/drain region SD17 to the source/drain region SD19, in which the conductive segment CS1 also corresponds to the connection between the first source/drain terminals of the transistors TP5 and TP6. The conductive segment CS2 further couples the source/drain region SD18 to the source/drain region SD20, and couples the source/drain region SD21 to the source/drain region SD23, in which the conductive segment CS2 also corresponds to the connection between the second source/drain terminals of the transistors TP5-TP6 and the first source/drain terminals of the transistors TR5-TR6. The conductive segment CS3 further couples the source/drain region SD22 to the source/drain region SD24, and couples the source/drain region SD30 to the source/drain region SD32, in which the conductive segment CS3 also corresponds to the connection between the second source/drain terminals of the transistors TR5-TR6 and the second source/drain terminals of the transistors TR7-TR8. The conductive segment CS5 further couples the source/drain region SD25 to the source/drain region SD27, in which the conductive segment CS5 also corresponds to the connection between the first source/drain terminals of the transistors TP7 and TP8. The conductive segment CS4 further couples the source/drain region SD26 to the source/drain region SD28, and couples the source/drain region SD29 to the source/drain region SD31, in which the conductive segment CS4 also corresponds to the connection between the second source/drain terminals of the transistors TP7-TP8 and the first source/drain terminals of the transistors TR7-TR8.

In the active area AA1, in some embodiments, the source/drain regions SD2 and SD5 are a continuous region and electrically coupled to each other. The source/drain regions SD6 and SD14 are a continuous region and electrically coupled to each other. The source/drain regions SD10 and SD13 are a continuous region and electrically coupled to each other. Similarly, in the active area AA2, in some embodiments, the source/drain regions SD4 and SD7, the source/drain regions SD8 and SD16, and the source/drain regions SD12 and SD15 are continuous regions, and electrically coupled to each other, respectively. In the active area AA3, in some embodiments, the source/drain regions SD18 and SD21 are a continuous region and electrically coupled to each other. The source/drain regions SD22 and SD30 are a continuous region and electrically coupled to each other. The source/drain regions SD26 and SD29 are a continuous region and electrically coupled to each other. Similarly, in the active area AA4, in some embodiments, the source/drain regions SD20 and SD23, the source/drain regions SD24 and SD32, and the source/drain regions SD28 and SD31 are continuous regions, and electrically coupled to each other, respectively.

In FIG. 7, a cut CM1 is illustrated to indicate that the conductive segments CS1-CS5 are separate into 2 parts. The upper part of the conductive segments CS1-CS5, in FIG. 7, corresponds to the bits 1-2 coupling to the bit line BL0, and the lower part of the conductive segments CS1-CS5, in FIG. 7, corresponds to the bits 3-4 coupling to the bit line BL1. In some embodiments, the upper part and the lower part of the conductive segments CS1-CS5 are electrically isolated from each other. Therefore, the voltage and/or current on the source/drain regions of active areas AA1-AA2 is isolated from the voltage and/or current on the source/drain regions of the active areas AA3-AA4. In some embodiments, the cut CM1 represents an empty space. In some embodiments, the cut CM1 is formed by performing a cut process after the conductive segments CS1-CS5 are formed. In some embodiments, the gates G1-G4 are not cut by the cut CM1. The cut CM1 is illustrated, in the layout view of the layout structure 700, to cross the gates G1-G4 between the active areas AA2-AA3, however, the gates G1-G4 are continuous between the active areas AA2-AA3. Alternatively stated, the gate portions G1B and G1C are a continuous gate portion crossing the active areas AA2-AA3, the gate portions G3B and G3C are a continuous gate portion crossing the active areas AA2-AA3, and the gates G2 and G4 are continuous gates crossing the active areas AA1-AA4. The cut CM1 in layout structure 700 is provided for illustrative purposes. Various cuts CM1 are within the contemplated scope of the present disclosure.

As shown in FIG. 7, the via VD1 is arranged above the upper part of the conductive segment CS3 and between the active area AA1 and the active area AA2, and the via VD2 is arranged above the lower part of the conductive segment CS3 and between the active area AA3 and the active area AA4. Alternatively stated, the via VD1 does not overlap the active areas AA1-AA2 in the layout view of the layout structure 700, and the via VD2 does not overlap the active areas AA3-AA4 in the layout view of the layout structure 700. The metal segment MS1 is arranged above the via VD1, and the metal segment MS2 is arranged above the via VD2. The via VD1 couples the upper part of the conductive segment CS3 to the metal segment MS1. In some embodiments, the source/drain regions SD6 and SD8, which correspond to second source/drain terminals of the transistors TR1-TR2, and the source/drain regions SD14 and SD16, which correspond to second terminals of the transistors TR3-TR4, are coupled through the upper part of the conductive segment CS3, the via VD1, and the metal segment MS1 to the bit line BL0 (not shown in FIG. 7.) The metal segment MS1 is configured to transmit the program current and/or read current to the bit line BL0. The via VD2 couples the lower part of the conductive segment CS3 to the metal segment MS2. In some embodiments, the source/drain regions SD22 and SD24, which correspond to second source/drain terminals of the transistors TR5-TR6, and the source/drain regions SD30 and SD32, which correspond to second terminals of the transistors TR7-TR8, are coupled through the lower part of the conductive segment CS3, the via VD2, and the metal segment MS2 to the bit line BL1 (not shown in FIG. 7.) The metal segment MS2 is configured to transmit the program current and/or read current to the bit line BL1.

As shown in FIG. 7, the via VG1 is arranged above the gate G1 and between the active area AA3 and the active area AA2, and the via VG2 is arranged above the gate G3 and between the active area AA3 and the active area AA2. Alternatively, the via VG1 is coupled to the gate portions G1B and G1C, and the via VG2 is coupled to the gate portions G3B and G3C. The metal segment MS3 is arranged above the vis VG1, and the metal segment MS4 is arranged above the vis VG2. The via VG1 couples the gate portions G1B and G1C to the metal segment MS3, and the via VG2 couples the gate portions G3B and G3C to the metal segment MS4. In some embodiments, the gate terminals of the transistors TP2 and TP5 are coupled through the via VG1 and the metal segment MS3 to the word line WLP0 (not shown in FIG. 7,) and the gate terminals of the transistors TP4 and TP7 are coupled through the via VG2 and the metal segment MS4 to the word line WLP1 (not shown in FIG. 7.) The metal segments MS4 and MS4 are configured to transmit the program current and/or read current to the word lines WLP0 and WLP1, respectively.

The above configuration of the layout structure 700 is provided for illustrative purposes. Various configurations of the layout structure 700 are within the contemplated scope of the present disclosure. For example, in various embodiments, the gate portion G3A is electrically coupled to the word line WLP1. In other words, the cut CP2 is not formed. In other embodiments, in alternatively embodiments, the gate portion G1A is electrically coupled to eh word line WLP0. In other words, the cut CP1 is not formed.

Figure 8:
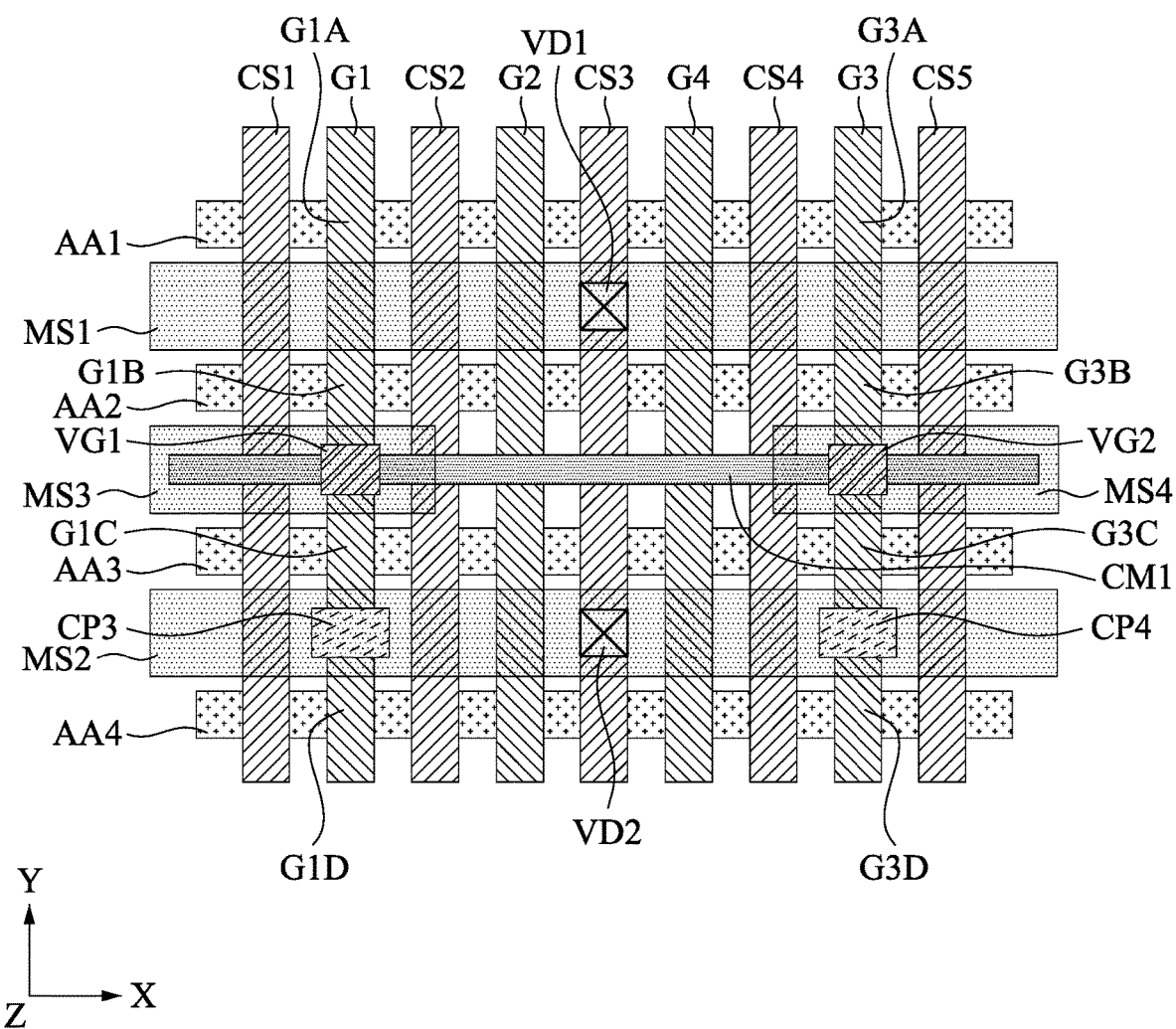
FIG. 8 is a layout structure of the anti-fuse memory cell array shown in FIG. 6 in accordance with other embodiments of the present disclosure.

Reference is made to FIG. 8. FIG. 8 is a layout structure 800 of the anti-fuse memory cell array 600 shown in FIG. 6 in accordance with other embodiments of the present disclosure. In some embodiments, the layout structure 800 is similar to the layout structure 700 shown in FIG. 7. In order to facilitate understanding, similar components in FIG. 8 are designated with the same reference numerals with reference to FIG. 7.

As shown in FIG. 8, the layout structure 800 includes active areas AA1-AA4, gates G1-G4, conductive segments CS1-CS5, metal segments MS1-MS4, vias VD1-VD2, and vias VG1-VG2. Because the layout structure 700 is similar to the layout structure 800, the source/drain regions SD1-SD32 are not shown in FIG. 8 for simplicity.

Compared to the layout structure 700, the gate portions G1A and G1B of the gate G1 in layout structure 800 are a continuous gate portion, and the portions G3A and G3B of the gate G3 in layout structure 800 are a continuous gate portion. As shown in FIG. 8, the cuts CP1-CP2 in layout structure 700 do not exist in the layout structure 800. Therefore, the gate portions G1A and G1B receive the programming voltage Vp and/or read voltage Vr from the word line WLP0 (not shown in FIG. 8,) and the gate portions G3A and G3B receive the programming voltage Vp and/or read voltage Vr from the word line WLP1 (not shown in FIG. 8.) Alternatively stated, the gate terminals of the transistors TP1 and TP2, corresponding to the gate portions G1A and G1B, of anti-fuse memory cell array 600 are configured to receive the programming voltage Vp and/or read voltage Vr from the word line WLP0, and the gate terminals of the transistors TP3 and TP4, corresponding to the gate portions G3A and G3B, of anti-fuse memory cell array 600 are configured to receive the programming voltage Vp and/or read voltage Vr from the word line WLP1.

Figure 9:
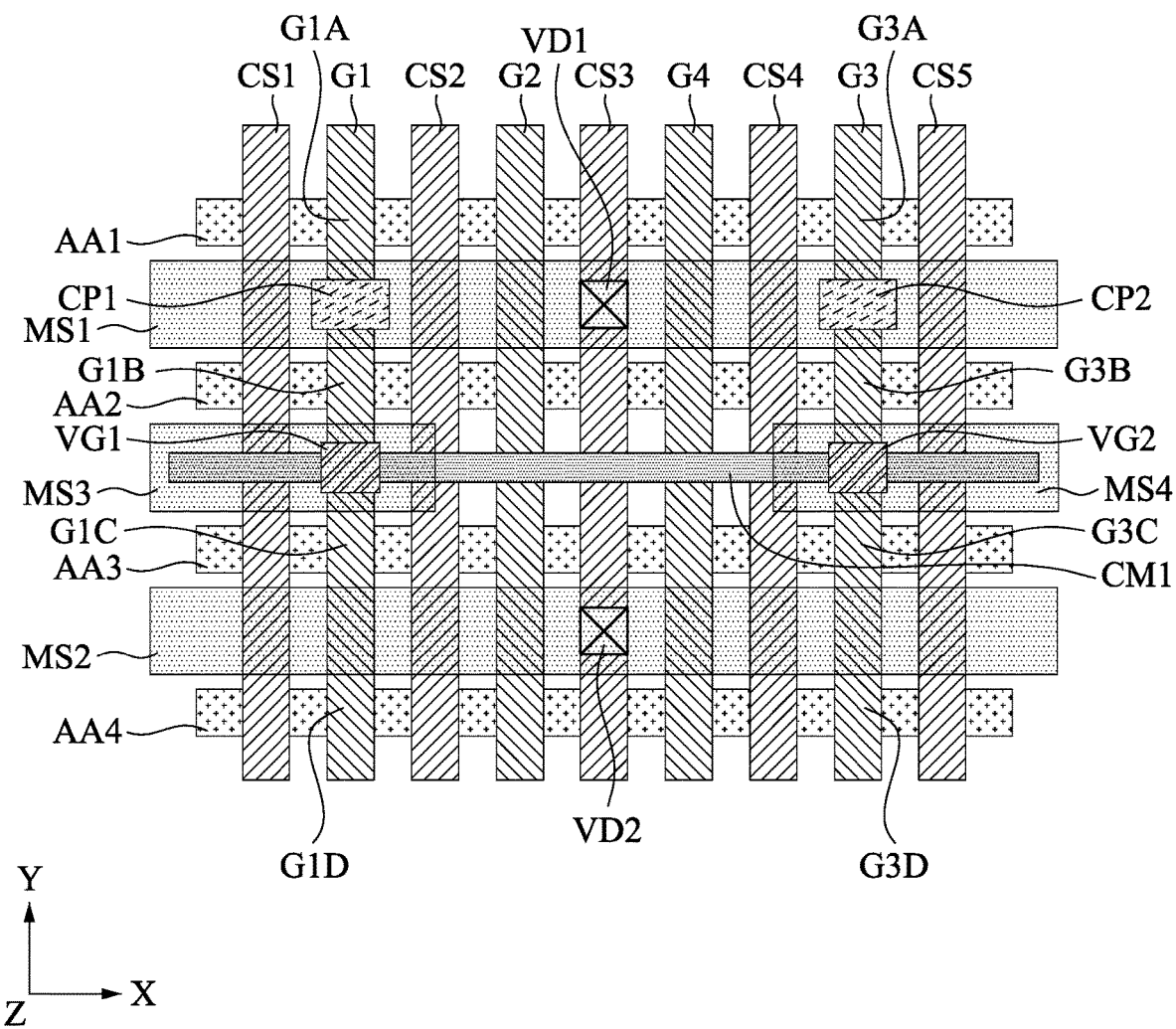
FIG. 9 is layout structure of the anti-fuse memory cell array shown in FIG. 6 in accordance with various embodiments of the present disclosure.

Reference is made to FIG. 9. FIG. 9 is a layout structure 900 of the anti-fuse memory cell array 600 shown in FIG. 6 in accordance with various embodiments of the present disclosure. In some embodiments, the layout structure 900 is similar to the layout structure 700 shown in FIG. 7. In order to facilitate understanding, similar components in FIG. 9 are designated with the same reference numerals with reference to FIG. 7.

As shown in FIG. 9, the layout structure 900 includes active areas AA1-AA4, gates G1-G4, conductive segments CS1-CS5, metal segments MS1-MS4, vias VD1-VD2, and vias VG1-VG2. Because the layout structure 700 is similar to the layout structure 900, the source/drain regions SD1-SD32 are not shown in FIG. 9 for simplicity.

Compared to the layout structure 700, the gate portions G1C and G1D of the gate G1 in layout structure 900 are a continuous gate portion, and the portions G3C and G3D of the gate G3 in layout structure 900 are a continuous gate portion. As shown in FIG. 9, the cuts CP3-CP4 in layout structure 700 do not exist in the layout structure 900. Therefore, the gate portions G1C and G1D receive the programming voltage Vp and/or read voltage Vr from the word line WLP0 (not shown in FIG. 9,) and the gate portions G3C and G3D receive the programming voltage Vp and/or read voltage Vr from the word line WLP1 (not shown in FIG. 9.) Alternatively stated, the gate terminals of the transistors TP5 and TP6, corresponding to the gate portions G1C and G1D, of anti-fuse memory cell array 600 are configured to receive the programming voltage Vp and/or read voltage Vr from the word line WLP0, and the gate terminals of the transistors TP7 and TP8, corresponding to the gate portions G3C and G3D, of anti-fuse memory cell array 600 are configured to receive the programming voltage Vp and/or read voltage Vr from the word line WLP1.

The layout structures 700, 800, and 900 are provided for illustrative purposes. Various layout structures 700, 800, and 900 are within the contemplated scope of the present disclosure. For example, in various embodiments of the layout structure 800, the gate portions G1A and G1B are electrically coupled to each other, and the gate portions G3A and G3B are electrically isolated from each other. In other words, the cuts CP2-CP4 are formed in the layout structure 800, and the cut CP1 is not formed in the layout structure 800. In another example, in alternatively embodiments of the layout structure 900, the gate portions gate G3A and G3B are electrically coupled to each other, and the gate portions G1C and G1D are electrically isolated from each other. In other words, the cuts CP1 and CP4 are formed in the layout structure 900, and the cuts CP2 and CP3 are not formed in the layout structure 900.

Figure 10:
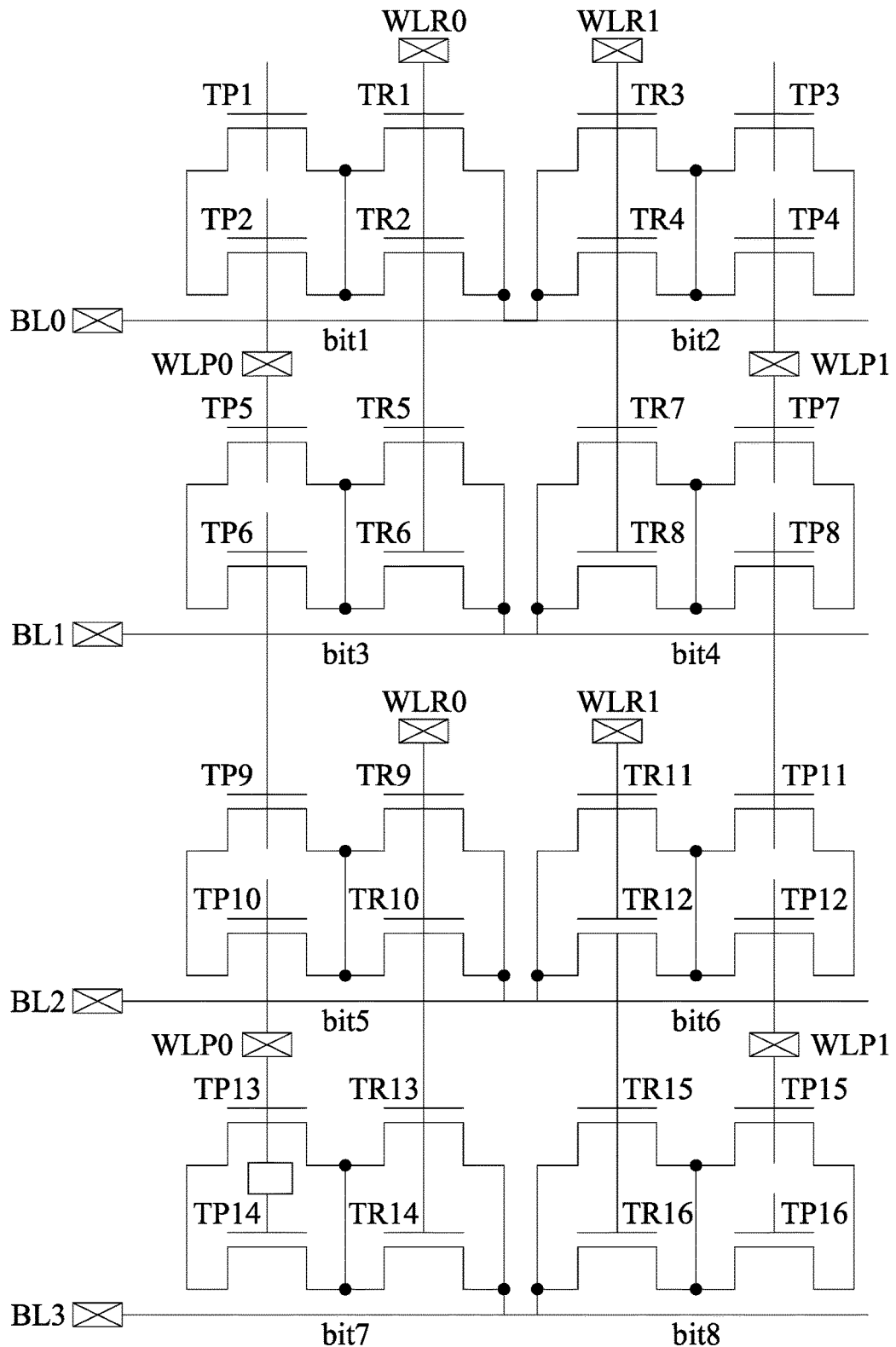
FIG. 10 is a circuit diagram of an anti-fuse memory cell array in accordance with some embodiments of the present disclosure.

Reference is made to FIG. 10. FIG. 10 is a circuit diagram of an anti-fuse memory cell array 1000 in accordance with some embodiments of the present disclosure. The anti-fuse memory cell array 1000 includes bits 1-8, and the bits 1-8 are arranged in a 4×8 array as shown in FIG. 10. In some embodiments, the anti-fuse memory cell array 600 is part of the anti-fuse memory cell array 1000. In some embodiments, the anti-fuse memory cell array 1000 includes 2 anti-fuse memory cell arrays 600 which arranged in 4 rows of the array. In some embodiments, the bits 1-4 correspond to the first anti-fuse memory cell arrays 600, and the bits 5-8 correspond to the second anti-fuse memory cell arrays 600. In order to facilitate understanding, similar components in FIG. 10 are designated with the same numerals with reference to FIG. 6. In addition, some of numerals in FIG. 6 are omitted in FIG. 10 for simplicity.

As shown in FIG. 10, the bits 1-2 are arranged at a same row and coupled to the bit line BL0, the bits 3-4 are arranged at a same row and coupled to the bit line BL1, the bits 5-6 are arranged at a same row and coupled to the bit line BL2, and the bits 7-8 are arranged at a same row and coupled to the bit line BL3. The bits 1, 3, 5, and 7 are arranged at a same column coupled to the word lines WLP0 and WLR0, and the bits 2, 4, 6, and 8 are arranged at a same column coupled to the word lines WLP1 and WLR1.

In some embodiments, like the anti-fuse memory cell array 600, the anti-fuse memory cell array 1000 is implemented by transistors. As shown in FIG. 10, the anti-fuse memory cell array 1000 is implemented by transistors TP1-TP16 and transistors TR1-TR16.

In some embodiments, gate terminals of the transistors TP1 and TP2 are electrically isolated from each other, gate terminals of the transistors TP3 and TP4 are electrically isolated from each other, gate terminals of the transistors TP5 and TP6 are electrically isolated from each other, gate terminals of the transistors TP7 and TP8 are electrically isolated from each other, gate terminals of the transistors TP9 and TP10 are electrically isolated from each other, gate terminals of the transistors TP11 and TP12 are electrically isolated from each other, gate terminals of the transistors TP13 and TP14 are electrically isolated from each other, and gate terminals of the transistors TP15 and TP16 are electrically isolated from each other.

In some embodiments, the program operation and the read operation of the anti-fuse memory cell array 1000 is similar to the program operation and the read operation of the anti-fuse memory cell array 600. Accordingly, the program operation and the read operation of the anti-fuse memory cell array 1000 are not further detailed herein.

In some embodiments, the gate terminals of the transistor TP2, TP5, TP10, and TP13 are coupled to the word line WLP0 and configured to receive the programming voltage Vp and/or the read voltage Vr from the word line WLP0, and the gate terminals of the transistor TP4, TP7, TP12, and TP15 are coupled to the word line WLP1 and configured to receive the programming voltage Vp and/or the read voltage Vr from the word line WLP1. In some embodiments, the gate terminals of the transistors TP6 and TP9 are coupled to each other, and the gate terminals of the transistors TP8 and TP11 are coupled to each other. In other embodiments, at least part of the gate terminals of the transistors TP1, TP3, TP6, TP8, TP9, TP11, TP14, and TP16 are floated.

Figure 11:
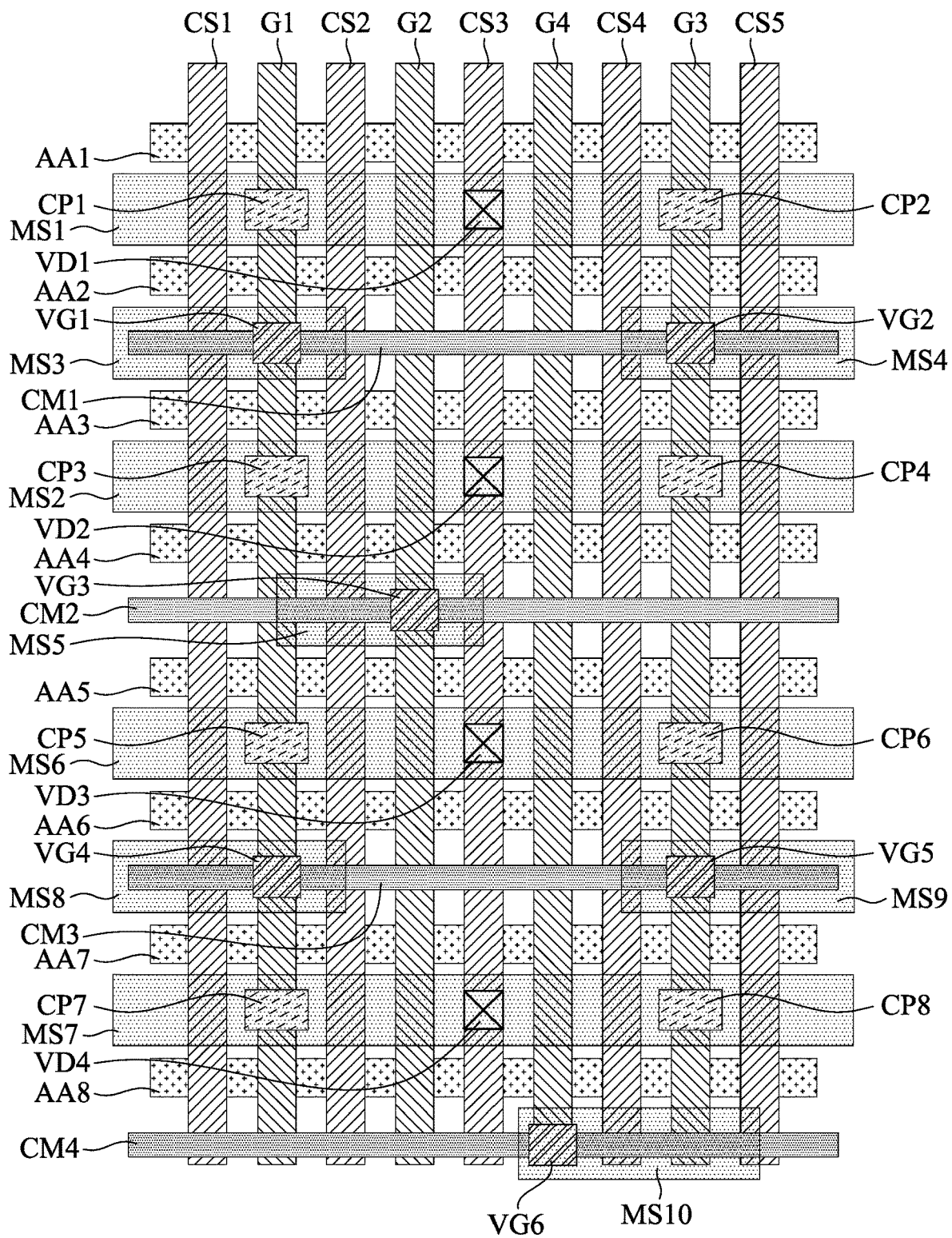
FIG. 11 is a layout structure of the anti-fuse memory cell array shown in FIG. 10 in accordance with some embodiments of the present disclosure.

Reference is made to FIG. 11. FIG. 11 is a layout structure 1100 of the anti-fuse memory cell array 1000 shown in FIG. 10 in accordance with some embodiments of the present disclosure. In some embodiments, the layout structure 1100 is similar to the layout structure 700. In order to facilitate understanding, similar components in FIG. 11 are designated with the same reference numerals with reference to FIG. 7.

As shown in FIG. 11, the layout structure 1100 includes active areas AA1-AA8, gates G1-G4, conductive segments CS1-CS5, metal segments MS1-MS10, via VD1-VD4, and via VG1-VG6.

In some embodiments, the layout structure 1100 includes 2 layout structures 700 coupling to each other. In some embodiments, the arrangement between active areas AA1 and AA4 in the layout view of the layout structure 1100 corresponds to the first layout structure 700, and the arrangement between active areas AA5 and AA8 in the layout view of the layout structure 1100 corresponds to the second layout structure 700. Therefore, the active area AA1-AA4, the metal segments MS1-MS5, the vias VD1-VD2, the vias VG1-VG3, the cuts CP1-CP4, and the cuts CM1-CM2 correspond to the active area AA5-AA8, the metal segments MS6-MS10, the vias VD3-VD4, the vias VG4-VG6, the cuts CP5-CP8, and the cuts CM3-CM4, respectively. Accordingly, the arrangement corresponding to the layout structure 700 is not further detailed herein.

Compared to the layout structure 700 (which corresponds to the first layout structure 700 mentioned above,) the layout structure 1100 further includes the via VG3 and the metal segment MS5. As shown in FIG. 11, the via VG3 is arranged above the gate G2 and between the active area AA4 and the active area AA5, and the metal segment MS5 is arranged above the via VG3. The via VG3 and the metal segment MS5 couple the gate G2 to the word line WLR0, and are configured to receive the selecting voltage Vdd from the word line WLR0. Alternatively, the gate terminals of the transistors TR1, TR2, TR5, TR6, TR9, TR10, TR13, and TR14 corresponding to the gate G2 are coupled through the via VG3 and the metal segment MS5 to the word line WLR0. Similarly, the VG6 is arranged above the gate G4 and at an opposite side of the active area AA8 with respect to the active area AA7, and the metal segment MS10 is arranged above the via VG6. The via VG6 and the metal segment MS10 couple the gate G4 to the word line WLR1, and are configured to receive the selecting voltage Vdd from the word line WLR1. Alternatively, the gate terminals of the transistors TR3, TR4, TR7, TR8, TR11, TR12, TR15, and TR16 corresponding to the gate G4 are coupled through the via VG6 and the metal segment MS10 to the word line WLR1.

Figure 12:
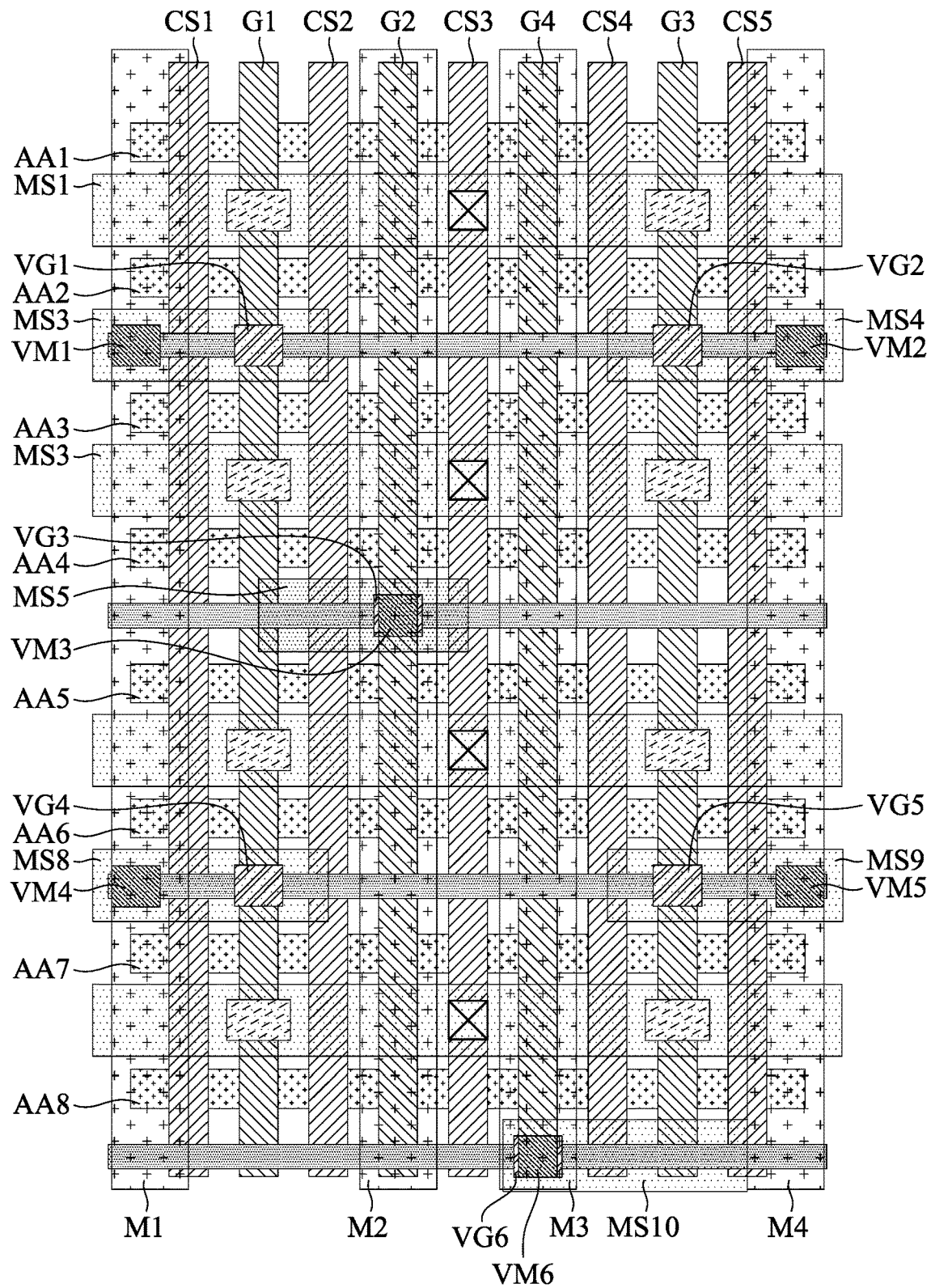
FIG. 12 is a layout structure of the anti-fuse memory cell array shown in FIG. 10 in accordance with various embodiments of the present disclosure.

Reference is made to FIG. 12. FIG. 12 is a layout structure 1200 of the anti-fuse memory cell array 1000 shown in FIG. 10 in accordance with various embodiments of the present disclosure. In some embodiments, the layout structure 1200 includes the layout structure 1100 shown in FIG. 11. In order to facilitate understanding, similar components in FIG. 12 are designated with the same reference numerals with reference to FIG. 11.

Compared to the layout structure 1100, the layout structure 1200 further includes a via VM1, a via VM2, a via VM3, a via VM4, a via VM5, a via VM6, a metal segment M1, a metal segment M2, a metal segment M3, and a metal segment M4. For simplicity, some reference numerals in FIG. 11 are omitted in FIG. 12.

As shown in FIG. 12, the via VM1 is arranged above the metal segment MS3, the via VM2 is arranged above the metal segment MS4, the via VM3 is arranged above the metal segment MS5, the via VM4 is arranged above the metal segment MS8, the via VM5 is arranged above the metal segment MS9, and via VM6 is arranged above the metal segment MS10.

As shown in FIG. 12, the metal segment M1 is arranged above the via VM1 and the via VM4, the metal segment M2 is arranged above the via VM3, the metal segment M3 is arranged above the via VM2 and the via VM6, and the metal segment M4 is arranged above the via VM5. In some embodiments, the metal segments M1-M4 are arranged substantially parallel to the gate G1-G4. In some embodiments, the metal segments M1-M4 are arranged substantially parallel to the conductive segments CS1-CS5. In some embodiments, the metal segments M1-M4 are substantially perpendicular to the active areas AA1-AA8. In some embodiments, the metal segments M1-M4 are substantially perpendicular to the metal segments MS1-MS10.

In some embodiments, the via VM1 and the metal segment M1 couple the metal segment MS3 to the word line WLP0, and are configured to receive the programming voltage Vp and/or read voltage Vr from the word line WLP0. The via VM4 and the metal segment M1 couple the metal segment MS8 to the word line WLP0, and are configured to receive the programming voltage Vp and/or read voltage Vr from the word line WLP0. Alternatively stated, the gate terminals of the transistors TP2 and TP5 shown in FIG. 10 are coupled through the via VG1, the metal segments MS3, the via VM1, and the metal segment M1 to the word line WLP0, and the gate terminals of the transistors TP10 and TP13 shown in FIG. 10 are coupled through the via VG4, the metal segments MS8, the via VM4, and the metal segment M1 to the word line WLP0.

In some embodiments, the via VM2 and the metal segment M4 couple the metal segment MS4 to the word line WLP1, and are configured to receive the programming voltage Vp and/or read voltage Vr from the word line WLP1. The via VM5 and the metal segment M4 couple the metal segment MS9 to the word line WLP1, and are configured to receive the programming voltage Vp and/or read voltage Vr from the word line WLP1. Alternatively stated, the gate terminals of the transistors TP4 and TP7 shown in FIG. 10 are coupled through the via VG2, the metal segments MS4, the via VM2, and the metal segment M4 to the word line WLP1, and the gate terminals of the transistors TP12 and TP15 shown in FIG. 10 are coupled through the via VG5, the metal segments MS9, the via VM5, and the metal segment M4 to the word line WLP1.

In some embodiments, the via VM3 and the metal segment M2 couple the metal segment MS5 to the word line WLR0, and are configured to receive the selecting voltage Vdd from the word line WLR0. The via VM6 and the metal segment M3 couple the metal segment MS10 to the word line WLR1, and are configured to receive the selecting voltage Vdd from the word line WLR1. Alternatively stated, the gate terminals of the transistors TR1, TR2, TR5, TR6, TR9, TR10, TR13, and TR14 shown in FIG. 10 are coupled through the via VG3, the metal segments MS5, the via VM3, and the metal segment M2 to the word line WLR0, and the gate terminals of the transistors TR3, TR4, TR7, TR8, TR11, TR12, TR15, and TR16 shown in FIG. 10 are coupled through the via VG6, the metal segments MS10, the via VM6, and the metal segment M3 to the word line WLR1.

The configurations of the layout structures 1100 and 1200 are provided for the illustrative purposes. Various configurations of the layout structures 1100 and 1200 are within the contemplated scope of the present disclosure. For example, in various embodiments, the layout structures 1100 and 1200 include more bits arranged in the active areas AA1-AA8. For another example, in alternatively embodiments, the layout structures 1100 and 1200 include more active areas coupled to the gates G1-G4.

Figure 13:
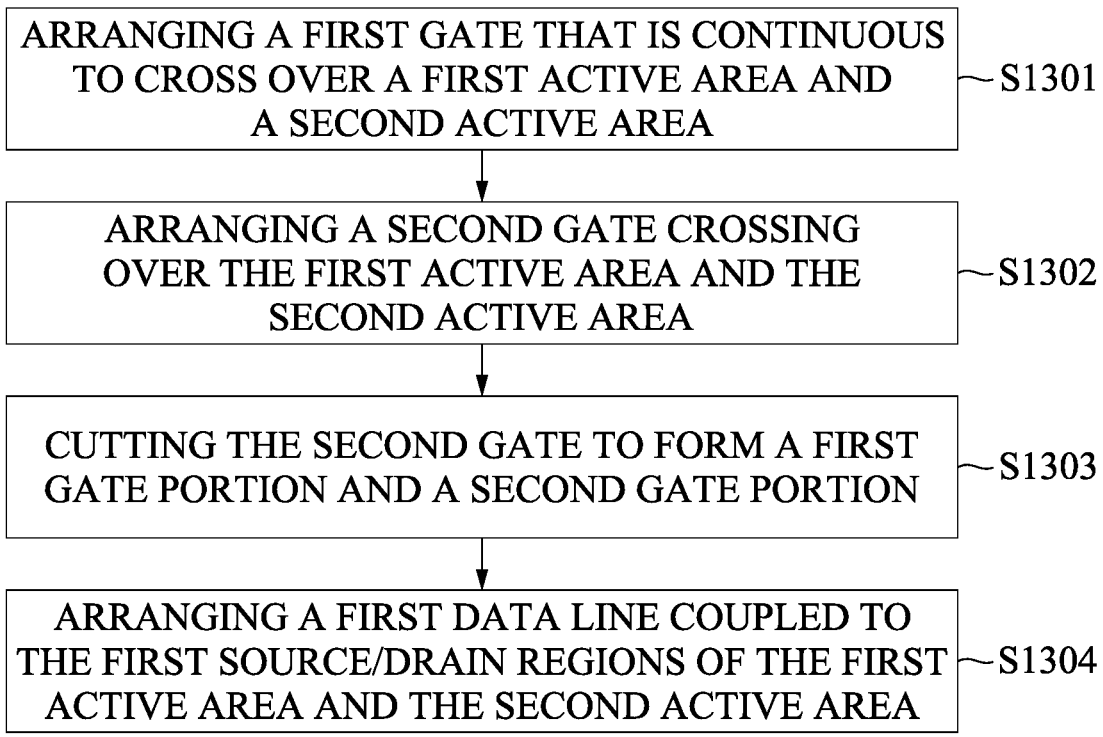
FIG. 13 is a flow chart of a method for generating an anti-fuse memory cell array in accordance with some embodiments of the present disclosure.

Reference is made to FIG. 13. FIG. 13 is a flow chart of a method 1300 for generating an anti-fuse memory cell array in accordance with some embodiments of the present disclosure. For ease of understanding, the method 1300 is described with reference to FIGS. 1-14. However, the method 1300 is not limited to being applied to generate the above layout structures. The method is able to be applied to generate any suitable layout structure. As shown in FIG. 15, the method 1300 includes operations S1301, S1302, S1303, and S1304, which will be discussed in detail below.

In operation S1301, the gate G2 that is continuous is arranged to cross over the active area AA1 and the active area AA2, for example as shown in FIGS. 1-2. A discussed above, the gate G2 corresponds to gate terminals of the transistor TR1 and the transistor TR2, and the source/drain region SD6 of the active area AA1 and the source/drain region SD8 of the active area AA2 correspond to second source/drain terminals of the transistor TR1 and the transistor TR2.

In operation S1302, with reference to FIG. 2, the gate G1 is arranged crossing over the active area AA1 and the active area AA2.

In operation S1303, with reference to FIGS. 1-2, the gate G1 is cut to form the gate portion G1A and the gate portion G1B that are electrically isolated from each other. As discussed above, the gate portion G1A and the gate portion G1B correspond to gate terminals of the transistor TP1 and the transistor TP2, respectively, the gate portion G1A crosses over the active area AA1, and the gate portion G1B crosses over the active area AA2.

In operation S1304, with reference to FIGS. 1-2, the bit line BL0 is arranged coupled to the source/drain region SD6 of the active area AA1 and the source/drain region SD8 of the active area AA2.

In some embodiments, with reference to FIGS. 1-2, the method 1300 further includes the following operations of: arranging the conductive segment CS3 crossing over the active area AA1 and the active area AA2; and arranging a via VD1 disposing on the conductive segment and between the active area AA1 and the active area AA2. In some embodiments, the bit line BL0 is coupled through the via VD1 and the conductive segment CS3 to the source/drain region SD6 of the active area AA1 and the source/drain region SD8 the active area.

In some embodiments, with reference to FIGS. 6-7, the operation S1301 includes the following operation of: arranging the gate G2 that is continuous to cross over the active area AA3 and the active area AA4 that are separate from each. In some embodiments, the gate G2 further corresponds to gate terminals of the transistor TP5 and the transistor TP6, and the source/drain region SD22 of the active area AA3 and the source/drain region SD24 of the active area AA4 correspond to first source/drain terminals od the fifth transistor and the sixth transistor.

In some embodiments, with reference to FIGS. 6-7, the operation S1302 includes the following operation of: arranging the gate G1 crossing over the active area AA3 and the active area AA4.

In some embodiments, with reference to FIGS. 6-7, the method 1300 further includes the following operations of: cutting the gate G1 to form the gate portion G1C and the gate portion G1D that are electrically isolated from each other; and arranging the bit line BL1 coupled to the source/drain region SD22 of the active area AA3 and the source/drain region SD24 of the active area AA4. In some embodiments, the gate portion G1C and the gate portion G1D correspond to gate terminals of the transistor TP5 and the transistor TP6, respectively. In some embodiments, the gate portion G1C crosses over the active area AA3, and the gate portion G1D crosses over the active area AA4.

In some embodiments, with reference to FIGS. 6-7, the method 1300 further includes the following operations of: arranging the via VG1 disposing on the gate G1 and between the active area AA2 and the active area AA3; and arranging the metal segment MS3 disposing on the via VG1 and between the active area AA2 and the active area AA3. In some embodiments, the gate portion G1B and the gate portion G1C are coupled through the via VG1 and the metal segment MS3 to the word line WLP0.

In some embodiments, with reference to FIGS. 6-7, the method 1300 further includes the following operations of: arranging the gate G4 that is continuous to cross over the active area AA1 and the active area AA2; arranging the gate G3 crossing over the active area AA1 and the active area AA2; and cutting the gate G3 to form the gate portion G3A and the gate portion G3B that are electrically isolated from each other. As discussed above, the gate G4 corresponds to gate terminals of the transistor TR3 and the transistor TR4, and the source/drain region SD14 of the active area AA1 and the source/drain region SD16 of the active area AA2 correspond to first source/drain terminals of the transistor TR3 and the transistor TR4. The gate portion G3A and the gate portion G3B correspond to gate terminals of the transistor TP3 and the transistor TP4, respectively. The gate portion G3A crosses over the active area AA1, and the gate portion G3B crosses over the active area AA2.

In some embodiments, the operation S1304 includes the following operation of: arranging the bit line BL0 coupled to the source/drain region SD14 of the active area AA1 and the source/drain region SD16 of the active area AA2.

In some embodiments, with reference to FIGS. 6-7, the method 1300 further includes the following operation of: arranging the via VG2 disposing on the gate G3 and between the active area AA2 and the active area AA3; and arranging the metal segment CS4 disposing on the via VG2 and between the active area AA2 and the active area AA3. In some embodiments, the gate portion G1C and the gate portion G1C are coupled through the via VG1 and the metal segment MS3 to the word line WLP0, and the gate portion G3B and the gate portion G3C are coupled through the via VG2 and the metal segment CS4 to the word line WLP1.

The above illustrations include exemplary operations, but the operations are not necessarily performed in the order shown. Operations may be added, replaced, changed order, and/or eliminated as appropriate, in accordance with the spirit and scope of various embodiments of the present disclosure.

Figure 14:
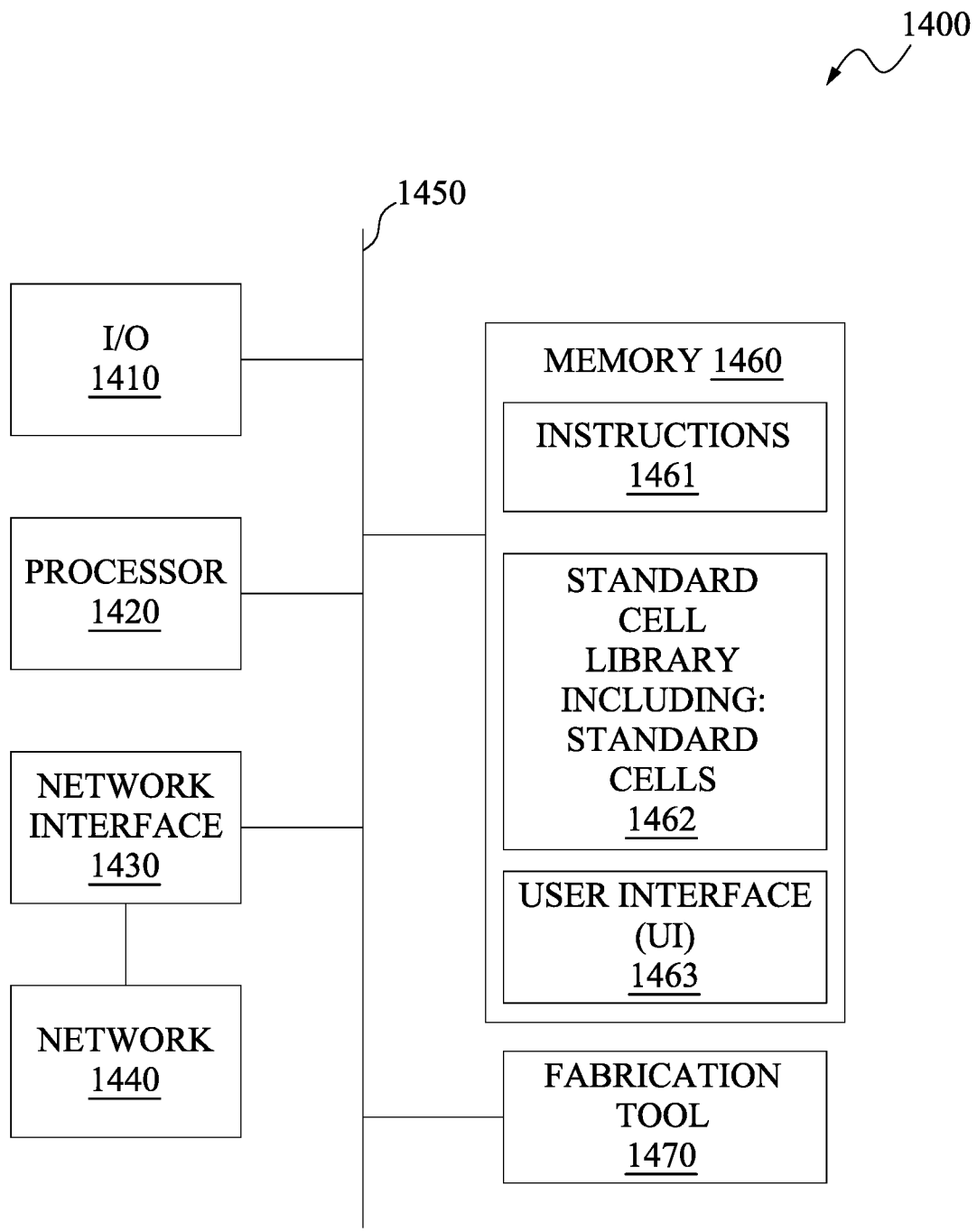
FIG. 14 is a block diagram of a system for designing an integrated circuit layout design in accordance with some embodiments of the present disclosure.
Figure 15:
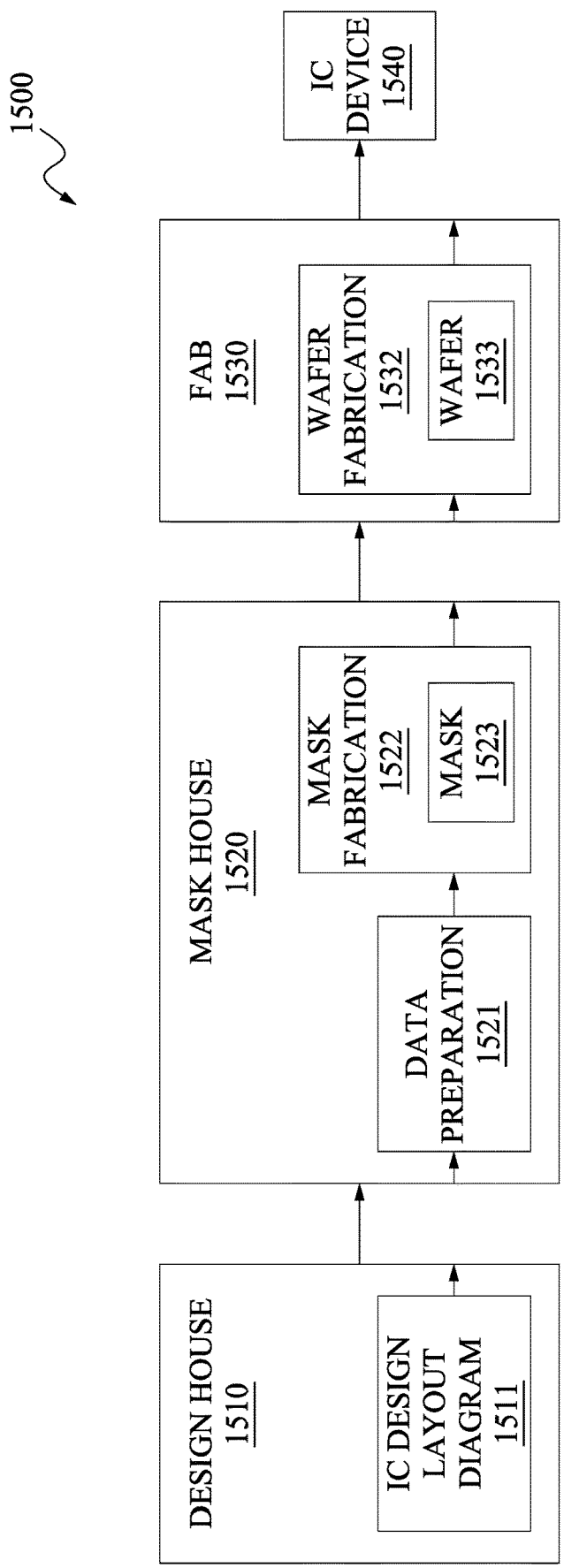
FIG. 15 is a block diagram of an integrated circuit manufacturing system, and an integrated circuit manufacturing flow associated therewith, in accordance with some embodiments.

Reference is now made to FIG. 14. FIG. 14 is a block diagram of an electronic design automation (EDA) system 1400 for designing an integrated circuit layout design, in accordance with some embodiments of the present disclosure. EDA system 1400 is configured to implement one or more operations of the method 1300 disclosed in FIG. 13, and further explained in conjunction with FIGS. 1-12. In some embodiments, EDA system 1400 includes an APR system.

In some embodiments, EDA system 1400 is a general purpose computing device including a hardware processor 1420 and a non-transitory, computer-readable storage medium 1460. Storage medium 1460, amongst other things, is encoded with, i.e., stores, computer program code (instructions) 1461, i.e., a set of executable instructions. Execution of instructions 1461 by hardware processor 1420 represents (at least in part) an EDA tool which implements a portion or all of, e.g., the method 1300.

The processor 1420 is electrically coupled to computer-readable storage medium 1460 via a bus 1450. The processor 1420 is also electrically coupled to an I/O interface 1410 and an fabrication tool 1470 by bus 1450. A network interface 1430 is also electrically connected to processor 1420 via bus 1450. Network interface 1430 is connected to a network 1440, so that processor 1420 and computer-readable storage medium 1460 are capable of connecting to external elements via network 1440. The processor 1420 is configured to execute computer program code 1461 encoded in computer-readable storage medium 1460 in order to cause EDA system 1400 to be usable for performing a portion or all of the noted processes and/or methods. In one or more embodiments, processor 1420 is a central processing unit (CPU,) a multi-processor, a distributed processing system, an application specific integrated circuit (ASIC,) and/or a suitable processing unit.

In one or more embodiments, computer-readable storage medium 1460 is an electronic, magnetic, optical, electromagnetic, infrared, and/or a semiconductor system (or apparatus or device.) For example, computer-readable storage medium 1460 includes a semiconductor or solid-state memory, a magnetic tape, a removable computer diskette, a random access memory (RAM,) a read-only memory (ROM,) a rigid magnetic disk, and/or an optical disk. In one or more embodiments using optical disks, computer-readable storage medium 1460 includes a compact disk-read only memory (CD-ROM,) a compact disk-read/write (CD-R/W,) and/or a digital video disc (DVD).

In one or more embodiments, storage medium 1460 stores computer program code 1461 configured to cause EDA system 1400 (where such execution represents (at least in part) the EDA tool) to be usable for performing a portion or all of the noted processes and/or methods. In one or more embodiments, storage medium 1460 also stores information which facilitates performing a portion or all of the noted processes and/or methods. In one or more embodiments, storage medium 1460 stores library 1462 of standard cells including such standard cells as disclosed herein, for example, a cell including transistors TP1-TP2 and TR1-TR2 discussed above with respect to FIGS. 1-2.

EDA system 1400 includes I/O interface 1410. I/O interface 1410 is coupled to external circuitry. In one or more embodiments, I/O interface 1410 includes a keyboard, keypad, mouse, trackball, trackpad, touchscreen, and/or cursor direction keys for communicating information and commands to processor 1420.

EDA system 1400 also includes network interface 1430 coupled to processor 1420. Network interface 1430 allows EDA system 1400 to communicate with network 1440, to which one or more other computer systems are connected. Network interface 1430 includes wireless network interfaces such as BLUETOOTH, WIFI, WIMAX, GPRS, or WCDMA; or wired network interfaces such as ETHERNET, USB, or IEEE-1664. In one or more embodiments, a portion or all of noted processes and/or methods, is implemented in two or more systems 1400.

EDA system 1400 also includes the fabrication tool 1470 coupled to the processor 1420. The fabrication tool 1470 is configured to fabricate integrated circuits, including, for example, the integrated circuit associated with the layout structures 200, 500, 700, 800, 900, 1100, and 1001200 illustrated in FIGS. 2, 5, 7, 8, 9, 11, and 12, based on the design files processed by the processor 1420 and/or the IC layout designs as discussed above.

EDA system 1400 is configured to receive information through I/O interface 1410. The information received through I/O interface 1410 includes one or more of instructions, data, design rules, libraries of standard cells, and/or other parameters for processing by processor 1420. The information is transferred to processor 1420 via bus 1450. EDA system 1400 is configured to receive information related to a UI through I/O interface 1410. The information is stored in computer-readable medium 1460 as user interface (UI) 1463.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1400. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

FIG. 15 is a block diagram of IC manufacturing system 1500, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 1500.

In FIG. 15, IC manufacturing system 1500 includes entities, such as a design house 1510, a mask house 1520, and an IC manufacturer/fabricator ("fab") 1530, that interact with one another in the design, development, and manufacturing cycles and/or services related to manufacturing an IC device 1540. The entities in IC manufacturing system 1500 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1510, mask house 1520, and IC fab 1530 is owned by a single larger company. In some embodiments, two or more of design house 1510, mask house 1520, and IC fab 1530 coexist in a common facility and use common resources.

Design house (or design team) 1510 generates an IC design layout diagram 1511. IC design layout diagram 1511 includes various geometrical patterns, for example, a layout structure depicted in FIG. 2, FIG. 5, FIG. 6, FIG. 7, FIG. 9, and/or FIG. 10, designed for an IC device 1540, for example, layout structures 200, 500, 700, 800, 900, 1100, and 1200, discussed above with respect to FIG. 2, FIG. 5, FIG. 6, FIG. 7, FIG. 9, and/or FIG. 10. The geometrical patterns correspond to patterns of metal, oxide, or semiconductor layers that make up the various components of IC device 1540 to be fabricated. The various layers combine to form various IC features. For example, a portion of IC design layout diagram 1511 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 1510 implements a proper design procedure to form IC design layout diagram 1511. The design procedure includes one or more of logic design, physical design or place and route. IC design layout diagram 1511 is presented in one or more data files having information of the geometrical patterns. For example, IC design layout diagram 1511 can be expressed in a GDSII file format or DFII file format.

Mask house 1520 includes data preparation 1521 and mask fabrication 1522. Mask house 1520 uses IC design layout diagram 1511 to manufacture one or more masks 1523 to be used for fabricating the various layers of IC device 1540 according to IC design layout diagram 1511. Mask house 1520 performs mask data preparation 1521, where IC design layout diagram 1511 is translated into a representative data file ("RDF"). Mask data preparation 1521 provides the RDF to mask fabrication 1522. Mask fabrication 1522 includes a mask writer. A mask writer converts the RDF to an image on a substrate, such as a mask (reticle) 1523 or a semiconductor wafer 1533. The IC design layout diagram 1511 is manipulated by mask data preparation 1521 to comply with particular characteristics of the mask writer and/or requirements of IC fab 1530. In FIG. 15, data preparation 1521 and mask fabrication 1522 are illustrated as separate elements. In some embodiments, data preparation 1521 and mask fabrication 1522 can be collectively referred to as mask data preparation.

In some embodiments, data preparation 1521 includes optical proximity correction (OPC) which uses lithography enhancement techniques to compensate for image errors, such as those that can arise from diffraction, interference, other process effects and the like. OPC adjusts IC design layout diagram 1511. In some embodiments, data preparation 1521 includes further resolution enhancement techniques (RET,) such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 1521 includes a mask rule checker (MRC) that checks the IC design layout diagram 1511 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1511 to compensate for limitations during mask fabrication 1522, which may undo part of the modifications performed by OPC in order to meet mask creation rules.

In some embodiments, data preparation 1521 includes lithography process checking (LPC) that simulates processing that will be implemented by IC fab 1530 to fabricate IC device 1540. LPC simulates this processing based on IC design layout diagram 1511 to create a simulated manufactured device, such as IC device 1540. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF",) mask error enhancement factor ("MEEF",) other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1511.

It should be understood that the above description of data preparation 1521 has been simplified for the purposes of clarity. In some embodiments, data preparation 1521 includes additional features such as a logic operation (LOP) to modify the IC design layout diagram 1511 according to manufacturing rules. Additionally, the processes applied to IC design layout diagram 1511 during data preparation 1521 may be executed in a variety of different orders.

After data preparation 1521 and during mask fabrication 1522, a mask 1523 or a group of masks 1523 are fabricated based on the modified IC design layout diagram 1511. In some embodiments, mask fabrication 1522 includes performing one or more lithographic exposures based on IC design layout diagram 1511. In some embodiments, an electron-beam (e-beam) or a mechanism of multiple e-beams is used to form a pattern on a mask (photomask or reticle) 1523 based on the modified IC design layout diagram 1511. Mask 1523 can be formed in various technologies. In some embodiments, mask 1523 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 1523 includes a transparent substrate (for example, fused quartz) and an opaque material (for example, chromium) coated in the opaque regions of the binary mask. In another example, mask 1523 is formed using a phase shift technology. In a phase shift mask (PSM) version of mask 1523, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1522 is used in a variety of processes. For example, such a mask(s) is used in an ion implantation process to form various doped regions in semiconductor wafer 1533, in an etching process to form various etching regions in semiconductor wafer 1533, and/or in other suitable processes.

IC fab 1530 includes wafer fabrication 1532. IC fab 1530 is an IC fabrication business that includes one or more manufacturing facilities for the fabrication of a variety of different IC products. In some embodiments, IC Fab 1530 is a semiconductor foundry. For example, there may be a manufacturing facility for the front end fabrication of a plurality of IC products (front-end-of-line (FEOL) fabrication,) while a second manufacturing facility may provide the back end fabrication for the interconnection and packaging of the IC products (back-end-of-line (BEOL) fabrication,) and a third manufacturing facility may provide other services for the foundry business.

IC fab 1530 uses mask(s) 1523 fabricated by mask house 1520 to fabricate IC device 1540. Thus, IC fab 1530 at least indirectly uses IC design layout diagram 1511 to fabricate IC device 1540. In some embodiments, semiconductor wafer 1533 is fabricated by IC fab 1530 using mask(s) 1523 to form IC device 1540. In some embodiments, the IC fabrication includes performing one or more lithographic exposures based at least indirectly on IC design layout diagram 1511. Semiconductor wafer 1533 includes a silicon substrate or other proper substrate having material layers formed thereon. Semiconductor wafer 1533 further includes one or more of various doped regions, dielectric features, multi-level interconnects, and the like (formed at subsequent manufacturing steps.)

In this document, the term "coupled" may also be termed as "electrically coupled," and the term "connected" may be termed as "electrically connected". "Coupled" and "connected" may also be used to indicate that two or more elements cooperate or interact with each other.

In some embodiments, a semiconductor device includes a first active area extending in a first direction; a second active area extending in the first direction and separated from the first active area in a second direction different from the first direction; a first gate extending in the second direction and crossing over the first active area and the second active area, the first gate comprising a first gate portion and a second gate portion electrically isolated from each other; a first conductive segment extending in the second direction and crossing over the first active area and the second active area; a first via arranged above the first conductive segment, wherein the first active area and the second active area are coupled through the first conductive segment to the first via; and a first continuous gate disposed between the first conductive segment and the first gate, and crossing over the first active area and the second active area.

In some embodiments, a semiconductor device includes a first transistor, a gate of the first transistor being coupled to a first word line; a second transistor, a gate of the second transistor being isolated from the first word line; a third transistor, a gate of the third transistor being coupled to a second word line; and a fourth transistor, a gate of the fourth transistor being coupled to the second word line, wherein a first source/drain region of the first transistor, a first source/drain region of the second transistor, a first source/drain region of the third transistor and a first source/drain region of the fourth transistor are coupled to each other, and a second source/drain region of the third transistor and a second source/drain region of the fourth transistor are coupled to each other.

In some embodiments, a semiconductor device includes a first transistor; a second transistor, a gate of the second transistor being isolated from a gate of the first transistor, a first source/drain region of the first transistor and a first source/drain region of the second transistor being coupled to each other; a third transistor, a first source/drain region of the third transistor being coupled to a second source/drain region of the first transistor; and a fourth transistor, a gate of the fourth transistor being coupled to a gate of the third transistor, a first source/drain region of the fourth transistor being coupled to a second source/drain region of the second transistor, a second source/drain region of the fourth transistor being coupled to a second source/drain region of the third transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first active area extending in a first direction;
a second active area extending in the first direction and separated from the first active area in a second direction different from the first direction;
a first gate extending in the second direction and crossing over the first active area and the second active area, the first gate comprising a first gate portion and a second gate portion electrically isolated from each other;
a first conductive segment extending in the second direction and crossing over the first active area and the second active area;
a first via arranged above the first conductive segment, wherein the first active area and the second active area are coupled through the first conductive segment to the first via;
a first continuous gate disposed between the first conductive segment and the first gate, and crossing over the first active area and the second active area; and
a first metal segment crossing over the first gate, and arranged between the first active area and the second active area, wherein the first via is configured to couple the first conductive segment to the first metal segment,
wherein the first gate, the first conductive segment and the first continuous gate have substantially the same height in a third direction.

2. The semiconductor device of claim 1, wherein the first metal segment further crosses over the first conductive segment and the first continuous gate.

3. The semiconductor device of claim 1, further comprising:

a second conductive segment configured to couple the first active area to the second active area, wherein the first gate is disposed between the second conductive segment and the first continuous gate.

4. The semiconductor device of claim 1, further comprising:
a second conductive segment configured to couple the first active area to the second active area, and disposed between the first gate and the first continuous gate.

5. The semiconductor device of claim 1, further comprising:
a second conductive segment configured to couple the first active area to the second active area, and disposed between the first gate and the first continuous gate; and
a second continuous gate disposed between the second conductive segment and the first conductive segment, and crossing over the first active area and the second active area.

6. The semiconductor device of claim 1, further comprising:
a third active area extending in the first direction and separated from the first active area and the second active area in the second direction; and
a second via arranged above the first gate and disposed between the third active area and the second active area.

7. The semiconductor device of claim 6, further comprising:
a third via arranged above the first conductive segment, wherein the third active area is disposed between the second active area and the third via.

8. The semiconductor device of claim 7, further comprising:
a second metal segment crossing over the first gate, the first conductive segment and the first continuous gate, and arrange above the third via, wherein the third via is configured to couple the first conductive segment to the second metal segment.

9. A semiconductor device, comprising:
a first active area;
a second active area;
a third active area, wherein the first active area and the second active area and the third active area are separated from each other;
a first gate comprising a first gate portion and a second gate portion electrically isolated from each other;
a first conductive segment configured to couple the first active area to the second active area;
a first continuous gate crossing over and coupled to each of the first active area, the second active area and the third active area; and
a via arranged above the first gate and disposed between the third active area and the second active area,
wherein the first gate is disposed between and separated from the first conductive segment and the first continuous gate,
the first gate portion crosses over and coupled to the first active area,
the second gate portion crosses over and coupled to each of the second active area and the third active area,
along a first direction, a distance between the first active area and the second active area is approximately equal to a distance between the third active area and the second active area, and
the second active area is interposed between the first active area and the third active area along the first direction.

10. The semiconductor device of claim 9, further comprising:
a second conductive segment disposed between the first gate and the first continuous gate, and configured to couple the first active area to the second active area.

11. The semiconductor device of claim 10, further comprising:
a third conductive segment and configured to couple the first active area to the second active area,
wherein the first continuous gate is disposed between the third conductive segment and the second conductive segment.

12. The semiconductor device of claim 11, further comprising:
a first metal segment coupled to the third conductive segment and crossing over each of the first conductive segment and the third conductive segment.

13. The semiconductor device of claim 12, further comprising:
a second metal segment coupled to the second gate portion, crossing over the first conductive segment, and configured to provide a programming voltage to each of the second active area and the third active area.

14. The semiconductor device of claim 11, further comprising:
a fourth active area separated from each of the first active area, the second active area and the third active area,
wherein the first continuous gate crosses over and is coupled to the fourth active area.

15. The semiconductor device of claim 14, wherein the first conductive segment is further configured to couple the third active area to the fourth active area.

16. The semiconductor device of claim 15, wherein the second conductive segment is further configured to couple the third active area to the fourth active area, and
the third conductive segment is further configured to couple the third active area to the fourth active area.

17. A semiconductor device, comprising:
a first active area;
a second active area;
a third active area;
a fourth active area, wherein the first active area, the second active area, the third active area and the fourth active area are separated from each other;
a first gate comprising a first gate portion and a second gate portion electrically isolated from each other;
a first continuous gate crossing over and coupled to each of the first active area, the second active area, the third active area and the fourth active area;
a first conductive segment configured to couple the first active area to the second active area, and couple the third active area to the fourth active area; and
a via arranged above the first gate and disposed between the third active area and the second active area,
wherein the first conductive segment is disposed between and separated from the first gate and the first continuous gate,
the first gate portion crosses over and coupled to the first active area,
the second gate portion crosses over and coupled to each of the second active area and the third active area, and
along a first direction, a distance between the first conductive segment and the first gate is approximately equal to a distance between the first conductive segment and the first continuous gate.

18. The semiconductor device of claim 17, further comprising:

a second conductive segment configured to couple the first active area to the second active area, and couple the third active area to the fourth active area, wherein the first continuous gate is disposed between and separated from the first conductive segment and the second conductive segment.

19. The semiconductor device of claim 17, further comprising:

a second conductive segment configured to couple the first active area to the second active area, and couple the third active area to the fourth active area, wherein the first gate is disposed between and separated from the first conductive segment and the second conductive segment.

20. The semiconductor device of claim 19, further comprising:

a third conductive segment configured to couple the first active area to the second active area, and couple the third active area to the fourth active area, wherein the second conductive segment, the first gate, the first conductive segment, the first continuous gate and the third conductive segment are arranged in order and are separated from each other.

* * * * *